(12) United States Patent
Varel et al.

(10) Patent No.: US 11,264,691 B2
(45) Date of Patent: Mar. 1, 2022

(54) GROUND PLANE HEATER

(71) Applicant: Kymeta Corporation, Redmond, WA (US)

(72) Inventors: Cagdas Varel, Seattle, WA (US); Steven Howard Linn, Hillsboro, OR (US); Ryan A. Stevenson, Woodinville, WA (US); Colin Stuart Short, Redmond, WA (US)

(73) Assignee: KYMETA CORPORATION, Redmond, WA (US)

( * ) Notice: Subject to any disclaimer, the term of this patent is extended or adjusted under 35 U.S.C. 154(b) by 0 days.

(21) Appl. No.: 16/927,808

(22) Filed: Jul. 13, 2020

(65) Prior Publication Data

US 2021/0021014 A1 Jan. 21, 2021

Related U.S. Application Data

(60) Provisional application No. 62/874,362, filed on Jul. 15, 2019.

(51) Int. Cl.
| | | |
|---|---|---|
| *H01Q 1/36* | (2006.01) | |
| *H01Q 1/02* | (2006.01) | |
| *G02F 1/1333* | (2006.01) | |
| *H01L 27/12* | (2006.01) | |
| *H01Q 7/00* | (2006.01) | |

(52) U.S. Cl.
CPC ......... *H01Q 1/02* (2013.01); *G02F 1/133382* (2013.01); *H01L 27/1218* (2013.01); *H01Q 7/005* (2013.01)

(58) Field of Classification Search
CPC ...... H01Q 1/02; H01Q 7/005; H01Q 21/0012; H01Q 3/44; G02F 1/133382; H01L 27/1218; H01L 27/1255; H05B 2203/008; H05B 2203/011; H05B 2203/014; H05B 2203/016; H05B 3/86
USPC .................................................. 343/700 R
See application file for complete search history.

(56) References Cited

U.S. PATENT DOCUMENTS

| | | | | |
|---|---|---|---|---|
| 7,420,519 B2* | 9/2008 | Durham | .................. | H01Q 1/38 |
| | | | | 343/700 MS |
| 7,821,470 B2* | 10/2010 | Azhari | ................... | H01Q 1/243 |
| | | | | 343/846 |
| 9,881,883 B2* | 1/2018 | Verma | ................. | H01L 23/5227 |
| 10,069,211 B2* | 9/2018 | Tonn | .................. | H01Q 15/0026 |
| 10,230,174 B2* | 3/2019 | Wang | ................... | H01Q 21/065 |
| 10,727,570 B2* | 7/2020 | Paulotto | ................ | H01Q 1/243 |

(Continued)

FOREIGN PATENT DOCUMENTS

| | | |
|---|---|---|
| JP | 2018014733 A | 1/2018 |
| KR | 1020150137079 A | 12/2015 |

OTHER PUBLICATIONS

International Search Report and Written Opinion on the Patentability of Application No. PCT/US2020042021, dated Oct. 29, 2020, 11 pages.

*Primary Examiner* — Jean B Jeanglaude
(74) *Attorney, Agent, or Firm* — Womble Bond Dickinson (US) LLP

(57) ABSTRACT

An antenna with a heater and method for using the same are disclosed. The antenna may comprise: an antenna aperture having a plurality of radio-frequency radiating antenna elements, the antenna aperture having a ground plane and a material for tuning permittivity or capacitance; and a heater structure in thermal contact with the material.

25 Claims, 30 Drawing Sheets

(56) References Cited

U.S. PATENT DOCUMENTS

| | | | |
|---|---|---|---|
| 2007/0139273 A1* | 6/2007 | Durham | H01Q 21/26 |
| | | | 343/700 MS |
| 2011/0297665 A1 | 12/2011 | Parker | |
| 2012/0287018 A1* | 11/2012 | Parsche | H01Q 1/38 |
| | | | 343/897 |
| 2015/0288063 A1 | 10/2015 | Johnson et al. | |
| 2018/0083360 A1* | 3/2018 | Tonn | H01Q 9/0428 |
| 2018/0146511 A1 | 5/2018 | Stevenson et al. | |

* cited by examiner

Iris L2

Iris L1

Patch and Iris L1

Top View

US 11,264,691 B2

GROUND PLANE HEATER

PRIORITY

The present patent application claims priority to and incorporates by reference the provisional patent application Ser. No. 62/874,362, titled "IRIS HEATER", filed Jul. 15, 2019.

FIELD OF THE INVENTION

Embodiments of the present invention relate to the field of radio frequency (RF) apertures used for communication; more particularly, embodiments of the present invention relate to RF apertures, such as, for example, antennas, that include internal heaters.

BACKGROUND

Certain antenna technologies require heating of the antenna in order to bring the antenna to an operational temperature. For example, certain antennas that utilize liquid crystals must have the liquid crystals heated to a specific temperature in order for the liquid crystal to operate as desired.

In prior art related to liquid crystal displays (LCD), resistive heating elements are used to keep the LC above a specific temperature for proper operation, for example in automotive display applications where ambient temperatures can reach −30 C to −40 C. These heating elements are made from transparent conductors, such as Indium Tin Oxide (ITO) on a separate glass substrate from the primary LCD substrate. This substrate is subsequently bonded to the primary LCD substrate to provide thermal conductivity. Because the heating element is transparent to optical frequencies, this is a straightforward and practical way to implement a heater for LCDs, even though the heating element is in the signal path.

This approach, however, is not feasible when considering LC-based antennas. Because ITO and similar materials are not transparent at RF frequencies, placing these types of heater elements in the path of the RF signal will attenuate the RF signal and degrade the performance of the antenna.

Consequently, prior art embodiments of LC-based antennas use resistive heating elements attached to the metal feed structure or other bulk mechanical structures with good thermal properties to heat an internal portion of the antenna where the LC layer resides. However, because the resistive heating elements are physically separated from the LC layer by a number of layers in the antenna stack-up, including layers of thermal insulators, significantly more heat power must be applied in order to heat the liquid crystal, as compared to the LCD implementation.

Other implementations of LC-based antenna heaters attempt to heat the LC layer from the edges of the antenna aperture. These embodiments require 400-500 W of power and require 30-40 minutes at this power to bring the LC layer to operational temperatures. This is an inefficient use of heating power resources.

SUMMARY

An antenna with a heater and method for using the same are disclosed. In one embodiment, the antenna comprises: an antenna aperture having a plurality of radio-frequency radiating antenna elements, the antenna aperture having a ground plane and a material for tuning permittivity or capacitance; and a heater structure in thermal contact with the material.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1A:
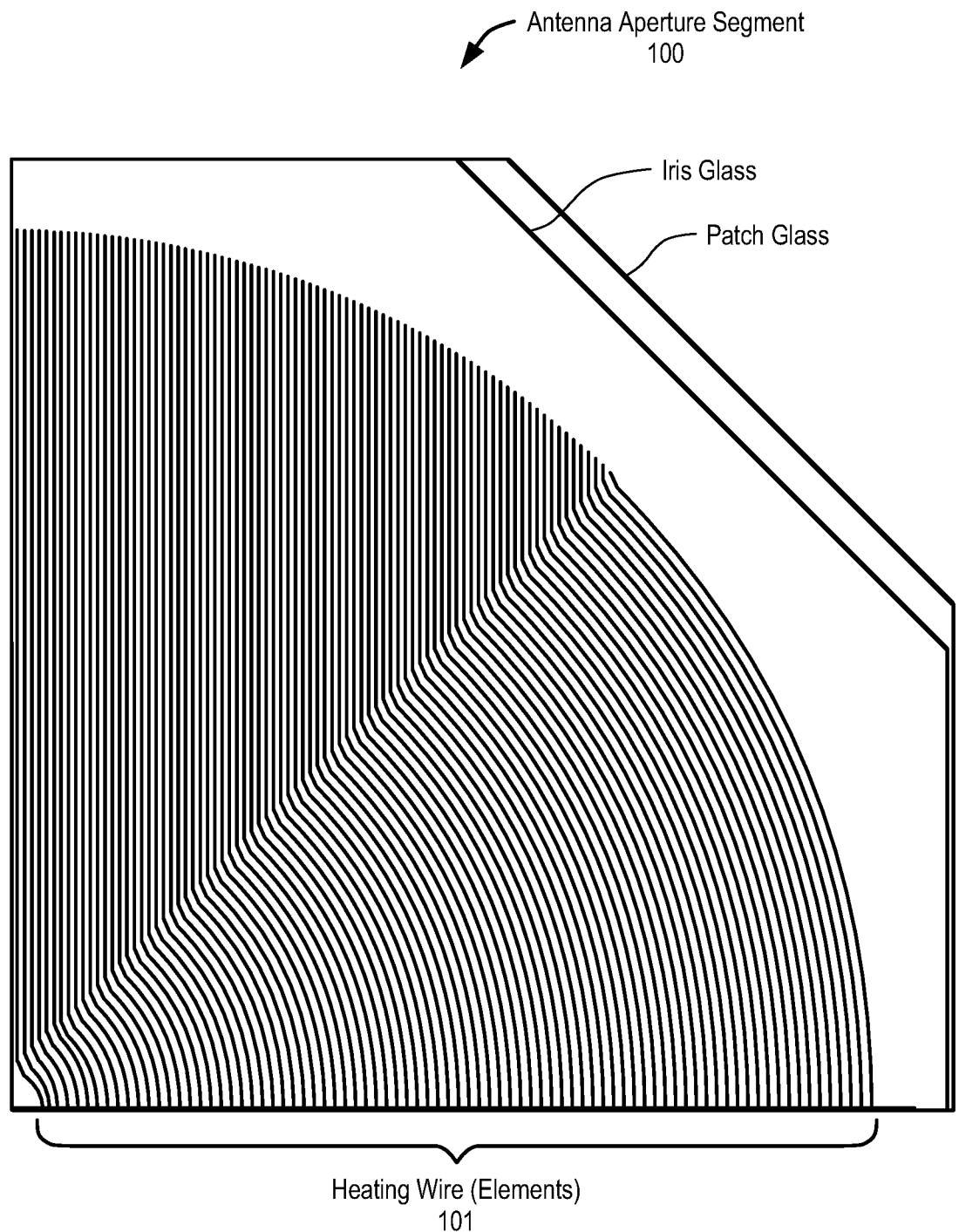
FIG. 1A illustrates heating wires with equal line lengths following gate and heater routing between RF elements.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Embodiments of the invention include techniques for placing heaters (e.g., heating elements) in the interior of an LC-based, radio frequency (RF) antenna aperture. In one embodiment, the heaters are placed inside the antenna aperture near the RF elements and closer to liquid crystal (LC) that is part of the RF antenna elements. This allows for more direct heating of the aperture, lessens the heater power requirements, and shortens the temperature rise time over techniques that use more indirect heating methods of raising the temperature inside the aperture, e.g., resistive heating elements on the back of the feed structure.

It is important that the heater implementation not interfere with the RF properties of the aperture. In one embodiment, the heater elements (e.g., heater traces) are located within the antenna aperture at locations that reduce, and potentially eliminate, interference with the RF signal while providing more direct heating within the aperture. In one embodiment, this is accomplished by putting heating elements between the RF elements on nearly the same plane as portions of the RF elements. In one embodiment, the location of the heater elements is in the same plane as the iris elements of an iris layer (e.g., iris metal layer) that is part of a patch/iris slotted-array antenna. By moving the heater wiring inside the aperture onto nearly the same plane as the iris layer, the interaction of the heating wires with the RF signal is reduced, and potentially minimized.

Techniques disclosed herein focus on concepts for realizing a resistive heater on the iris glass substrate of the metamaterial antenna. Examples of such antenna are described in more detail below and the attached addendum. In one embodiment, the metamaterial antenna uses a layer of liquid crystal (LC) material in its antenna element design as a tunable capacitor. In one embodiment, response of LC materials depend on temperature and the metamaterial antenna design is optimized for response from the LC at temperatures 10° C. and above. Because of that, the metamaterial antenna needs a heater structure for its operation at temperatures below 10° C. In one embodiment, this heater can be incorporated into the glass substrate design of the antenna having two glass substrates with an LC layer in between to provide efficient heating since two glass substrates are in direct contact with the LC layer. In one embodiment, the two glass substrates have iris and patch layers of a patch/slot antenna. In one embodiment, this heater incorporated into the iris glass substrate is referred to herein as the "iris heater". Heater design concepts described below can decrease a heating power requirement by several hundred watts in comparison to resistive heating elements attached to the metal feed structure or other bulk mechanical structures to heat an internal portion of the antenna where the LC layer resides.

The techniques disclosed herein also include methods for detecting the temperature within an antenna aperture. In one embodiment, the temperature is detected from a transistor directly on a transistor backplane. In one embodiment, the transistor backplane is a thin-film transistor (TFT) backplane. In one embodiment, if the transistors on the transistor backplane are in contact with an LC or other material, detecting the temperature of a transistor provides an indication of the temperature of the LC/material.

Techniques described herein decrease the cost of the heater system, require less power, decrease the rise time of the aperture temperature, and shrink the footprint of the controller board used to control the antenna. More specifically, in one embodiment, techniques described herein require 75-100 watts of power and will bring the LC layer temperature to operational temperature in 20 minutes.

Furthermore, temperature is typically sensed on a break-out printed circuit board (PCB) or a break out board (e.g., an interface board (e.g., an interface board to an antenna segment that is combined with other antenna segments to form an antenna aperture, etc.), which is substantially physically removed from the glass assembly that includes patch and iris glass layers and an LC layer. On-glass temperature sensing provides much tighter control of the thermal management feedback loop.

Overview

In one embodiment, the heater structure consists of several parts: the heating elements, heater power buses to supply the heater elements, and connection schemes to connect the heater power buses to the heater power supplies that are located outside the aperture. In one embodiment, the heater elements are wires. In one embodiment, the heater power buses are of very low resistance.

The implementation of heater wiring, heater buses, and heater connections, depending upon implementation, may require additional depositions of conductor layers, passivation layers, via openings and so on during aperture fabrication. These additional layers may serve to build the heater structures, isolate the heater structure electrically or chemically from other structures, and to provide interfaces for the heater to existing aperture structure as needed.

Heating Wires

It is desirable that the heating of the aperture occur uniformly. Two configurations of heating wires are described herein that may achieve this objective.

In one embodiment, the heating wires are of equal length and the cross sections of these heating wires are the same (or similar) in dimension over the length of the heating wires and from heating wire to heating wire. In the aggregate, this provides the same power dissipation per unit area over the aperture. In one embodiment, the heating wires are evenly distributed over the aperture quality area, with heating wires laying between irises, not crossing or contacting the patches or irises. In one embodiment, the heating wires are close to the same distance apart from each other (the same pitch) across the aperture area.

FIG. 1A illustrates an example of heating elements used to heat the RF antenna elements in an antenna aperture, where the heating wires have equal line lengths and follow gate routing and heater routing between RF elements. In one embodiment, the gate routing is the routing to control gates that turn on and off liquid crystal-based RF antenna elements, which is described in more detail below.

Referring to FIG. 1A, an antenna aperture segment 100 illustrates one quarter of an antenna array of RF antenna elements. In one embodiment, four antenna aperture segments are coupled together to form an entire array. Note that other numbers of segments may be used to construct an entire antenna array. For example, in one embodiment, the segments are shaped such three segments coupled together form a circular array of RF antenna elements. For more information on the antenna segments and the manner in which they are coupled together, see U.S. Application Patent Publication No. US2016/0261042, entitled "ANTENNA ELEMENT PLACEMENT FOR A CYLINDRICAL FEED ANTENNA", filed on Mar. 3, 2016 and see U.S. Application Patent Publication No. US2016/0261043, entitled "APERTURE SEGMENTATION OF A CYLINDRICAL FEED ANTENNA", filed on Mar. 3, 2016. Note that the techniques described herein are not limited to operate with antenna aperture segments and may be used on single apertures that contain an entire array of RF antenna elements.

Heating wires (elements) 101 are shown on antenna aperture segment 100. In one embodiment, the heating wires 101 are equal in length. In one embodiment, heating wires 101 are located between RF antenna elements (not shown) in the antenna array. In one embodiment, heating wires 101 follow the gate lines used to control gates to turn on and off individual RF antenna elements in the array. In one embodiment, heating wires 101 are equal distance between the RF elements.

In one embodiment, heating wires 101 are equal distance with respect to each other. In other words, the separation between pairs of heating wires is equal. Note that this is not a requirement, though it may help with providing more uniform heating of the antenna aperture. In one embodiment, when the antenna elements in the antenna array are located in rings, individual heating wires in heating wires 101 are equal distance between two consecutive rings of RF antenna elements. In alternative embodiments, the separation between pairs of heating wires is not equal.

It should be noted that the heater wiring depicted in FIG. 1A indicates the relative position and routing of the wiring, but does not represent the wiring size or number of wires. For example, in one embodiment, every other wire may be removed with the remaining wires providing the necessary heating where the heating is provided uniformly over an area. With respect to the size of the heating wires, their size is based on the material properties of the heating wire itself and the amount of heating the wires are to provide.

In one embodiment, the heating wire cross section (height and width) of heating wires 101 is chosen in the following way. First, the required power for heating the aperture area is converted, for a given desired heater supply voltage with the number and length of the heating wires, to a resistance for the heating wires. In turn, this resistance value is used in conjunction with properties of the heating wire materials to determine the required heating wire cross section. Note that other considerations may be used to select the heating wire cross section, including, but not limited to fabrication yields.

In another embodiment, the heating wires are unequal in length and their cross sections are not equal. In one embodiment, where the heating wires with unequal lengths are on concentric arcs between RF elements. In one embodiment, the heater wire widths are equal and the wire heights are adjusted radially from the center of the segment to provide uniform power per unit area over the aperture area.

Figure 1B:
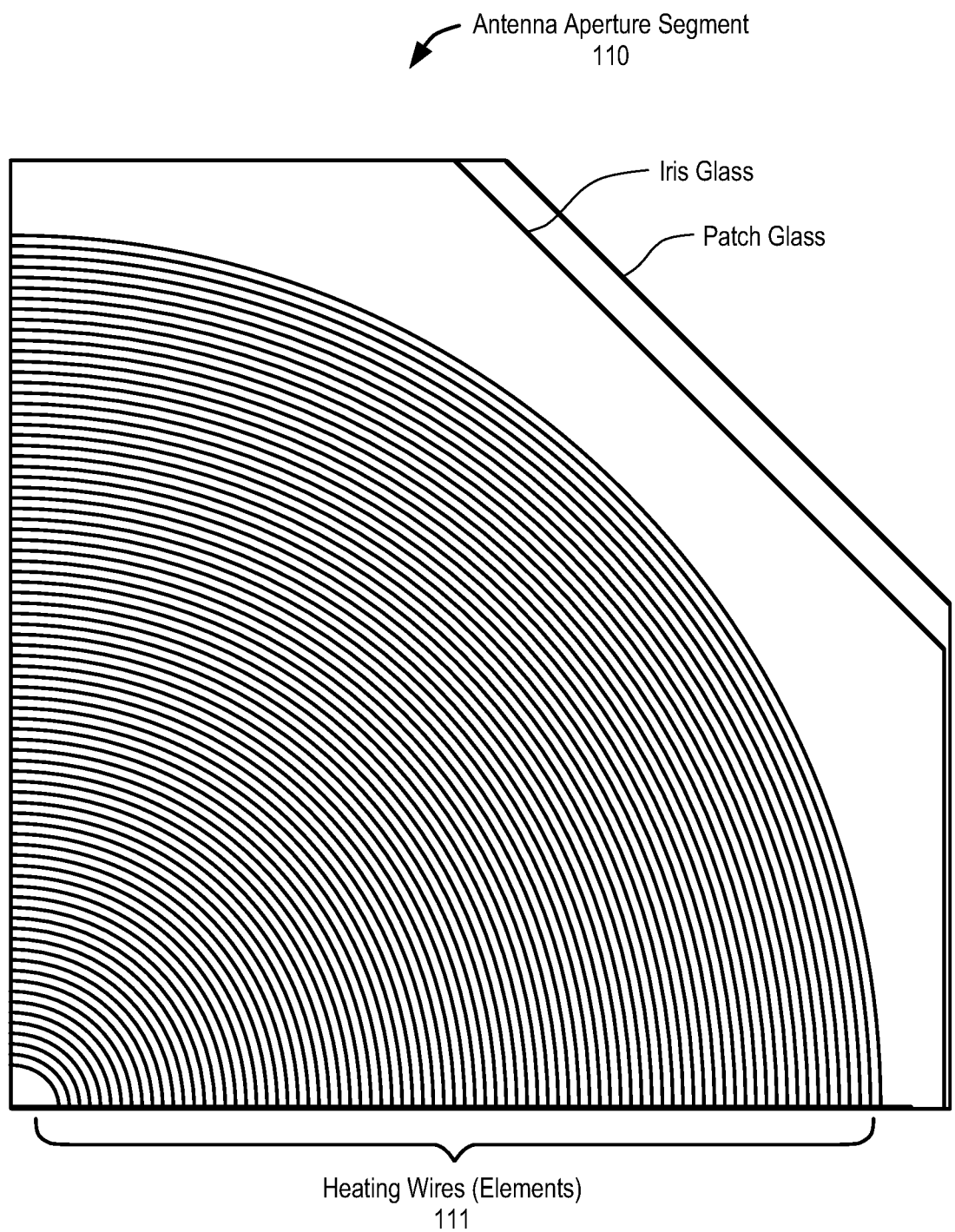
FIG. 1B illustrates heating wires with unequal lengths on concentric arcs between RF elements.

FIG. 1B illustrates an embodiment of the heating wire on an antenna aperture having heating wires of unequal length and their cross sections are unequal to each other. Referring to FIG. 1B, heating wires 111 are shown on antenna aperture segment 110, which is the same type of aperture segment as depicted in FIG. 1A. In one embodiment, a number of antenna apertures are coupled together to form a complete antenna array. As in FIG. 1A, in one embodiment, the heating wires are routed between the RF elements. In one embodiment, that routing follows the gate routing for the gates that control the antenna elements.

In one embodiment, an objective is still to provide nearly uniform power dissipation per unit area. In this case, however, the heights of the heating wire cross sections are varied over the aperture area to control the current and resistance to provide the same power dissipation per area although the heating wires are of unequal length.

It should be noted that the heater wiring depicted in FIG. 1B indicates the relative position and routing of the wiring, but does not represent the wiring size or number of wires. With respect to the size of the heating wires, their size is based on the material properties of the heating wire itself and the amount of heating the wires are to provide.

In one embodiment, the heating wires lie between the iris features and do not cross or contact the patch or iris features in a tunable slotted array of antenna elements having patch/slot pairs. In the illustration example provided in FIG. 2, the heating wires lie in rings midway between the rings of iris/patch elements, with an additional inside and outside ring of heating wires. In one embodiment, the rings of heating wiring are on concentric rings at the same radial pitch over the aperture area. In one embodiment, the heater wiring radial pitch is the same radial pitch as the RF elements. In alternative embodiments, the heater wiring radial pitch is not the same as the radial pitch of the RF elements.

In one embodiment, the heater wires lie close to equidistant between the RF elements.

Figure 2:
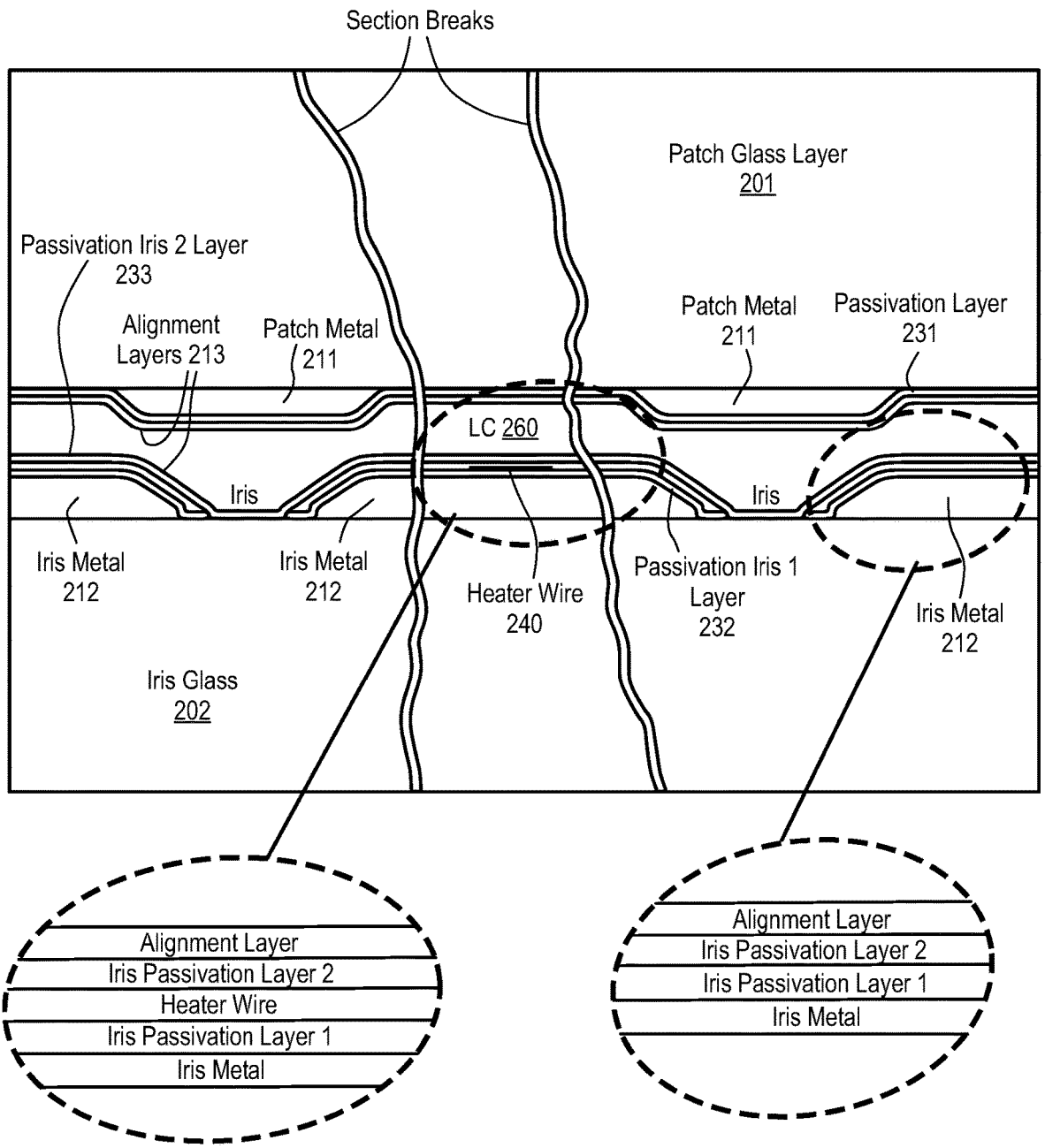
FIG. 2 illustrates an example cross section of one embodiment of an antenna aperture.

FIG. 2 illustrates an example cross section, or side view, of an antenna aperture having iris and patch layers. Referring to FIG. 2, patch glass layer 201 and iris glass layer 202 are separated with respect to each other include patch and iris slots, respectively, to form a tunable slotted array. Such an array is well-known and is also described in more detail below. In one embodiment, patch glass layer 201 and iris glass layer 202 are glass substrates. Note that the patch layer and iris layer may be referred to below as a patch glass layer and an iris glass layer, respectively. However, it should be understood that for purposes herein, the embodiments that include "patch glass layer" and "iris glass layer" may be implemented with a "patch substrate layer" and an "iris substrate layer," respectively, (or patch substrate and iris substrate) when the substrate is other than glass.

Patch metal layer 211 is fabricated onto patch glass layer 201. A passivation patch layer 231 is fabricated over patch metal layer 211. A liquid crystal (LC) alignment layer 213 is fabricated on top of passivation patch layer 231. Sections of iris metal layer 212 are fabricated onto iris glass layer 202. Passivation iris 1 layer 232 is fabricated over the iris metal layer 212. Heater wire 240 is fabricated on top of passivation iris layer 232. In one embodiment, heater wire 240 is close to equal distance between a pair of iris elements. Other heater wires are also located between iris elements in this fashion. Another passivation iris 2 layer 233 is fabricated over passivation iris 1 layer 232 and heater wire 240. LC alignment layer 213 is fabricated on top of passivation iris 2 layer 233.

Note that the LC alignment layer 213 is used to align the LC 260 so that it is pointing in a single direction in a manner well known in the art.

Heater Power Buses

Power buses are provided to supply power to the heater wires. Examples of these are illustrated in the figures below. In one embodiment, the power buses are of low resistance when compared to the heater wires, by several orders of magnitude, so that there is a small voltage drop from one end of the bus to the other, so that all of the heater wires may have the same voltage at each bus end of the heater wire. This makes it simpler to manage the power distribution to the network of heater wires.

In one embodiment, the heater buses are placed inside the aperture so that the heater wires are able to connect to the proper supply voltages at each end of the heater wire.

In one embodiment, the heater buses are separate structures placed into the apertures solely for the purpose of providing power to the heater wire network.

In another embodiment, existing structures in the aperture may be used to also act as heater buses. In one embodiment, the heater bus (or buses) are built into the seal structure of the aperture. In another case, the iris metal (e.g., copper) plane may be used as a heater bus to sink or source current for the heater wires.

Figure 3A:
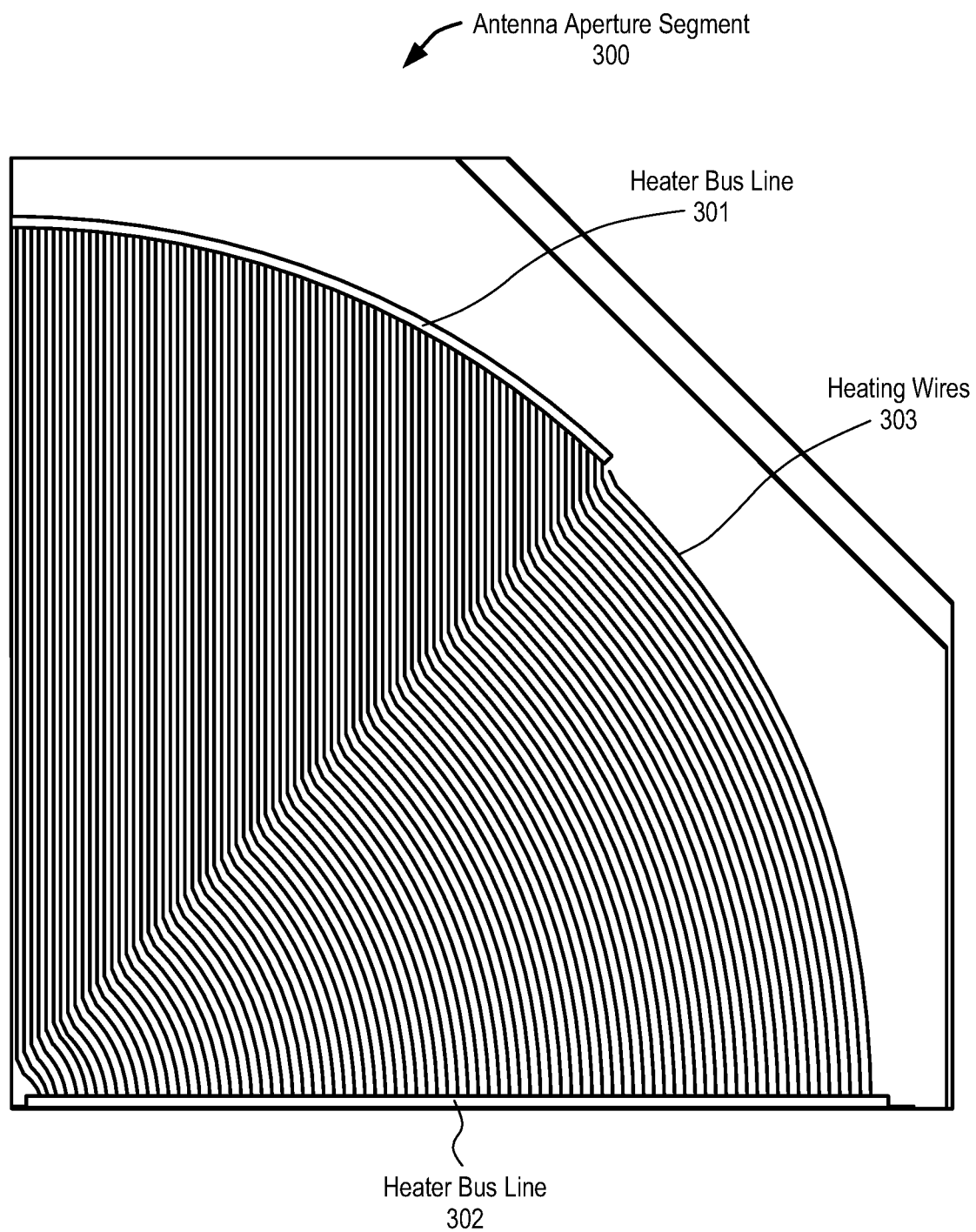
FIG. 3A illustrates an example of a heater bus placement for heater wires of equal length.

FIG. 3A illustrates an example of heater power bus placement integrated on an antenna aperture for heater wires of equal length. Referring FIG. 3A, antenna aperture segment 300, which represents one of the antenna segments that are coupled together to form an entire antenna array, includes heater bus lines 301 and 302. Heater power bus lines 301 and 302 are electrically connected to and provide power to heater wires 303.

Figure 3B:
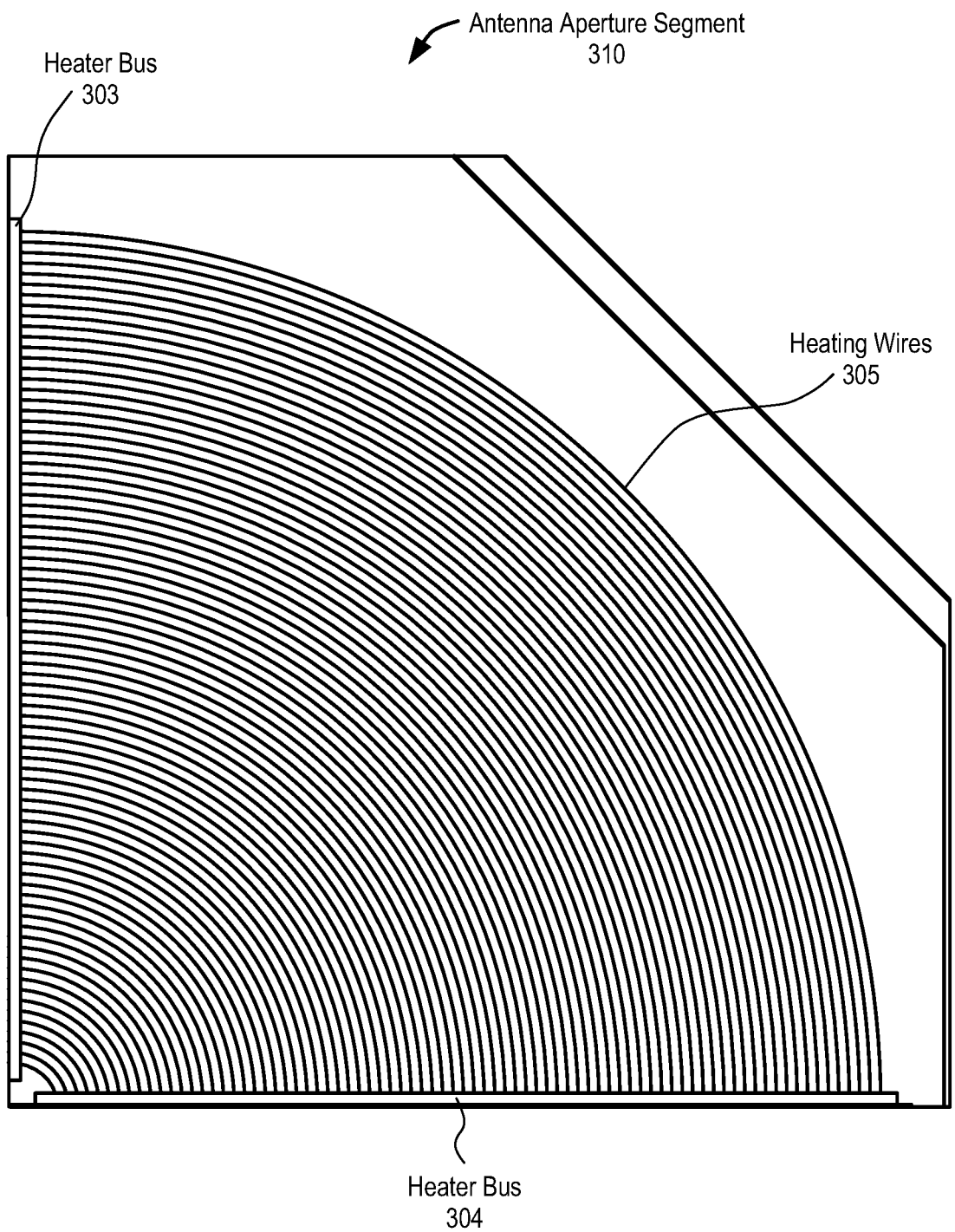
FIG. 3B illustrates an example of heater bus placement for heater wires of unequal length.

FIG. 3B illustrates an example of heater power bus placement integrated on an antenna aperture for heater wires of unequal length. Referring to FIG. 3B, heater power buses 303, 304 are electrically connected to heater wires 305 on antenna aperture segment 310.

Heater Bus to Power Supply Connection

In one embodiment, heater buses on the inside of the aperture are brought outside of the aperture structure to make connection to the heater power supply. In one embodiment, this can be accomplished by connecting the heater buses through a border seal structure at the outer portion of the antenna aperture to a metallization layer on one of the layers in the aperture outside the aperture border seal. For example, one such metallization layer is on the iris glass layer or on the patch glass layer. This metallization connects to the heater buses inside the seal and extends from inside the seal, through the seal, and out to portions of the patch or iris glass layers that extend beyond each other. These may be referred to as overhang regions. In such cases, portions of the patch or iris glass layers beneath those overhang regions may be referred to as under-hang regions.

Figure 4A:
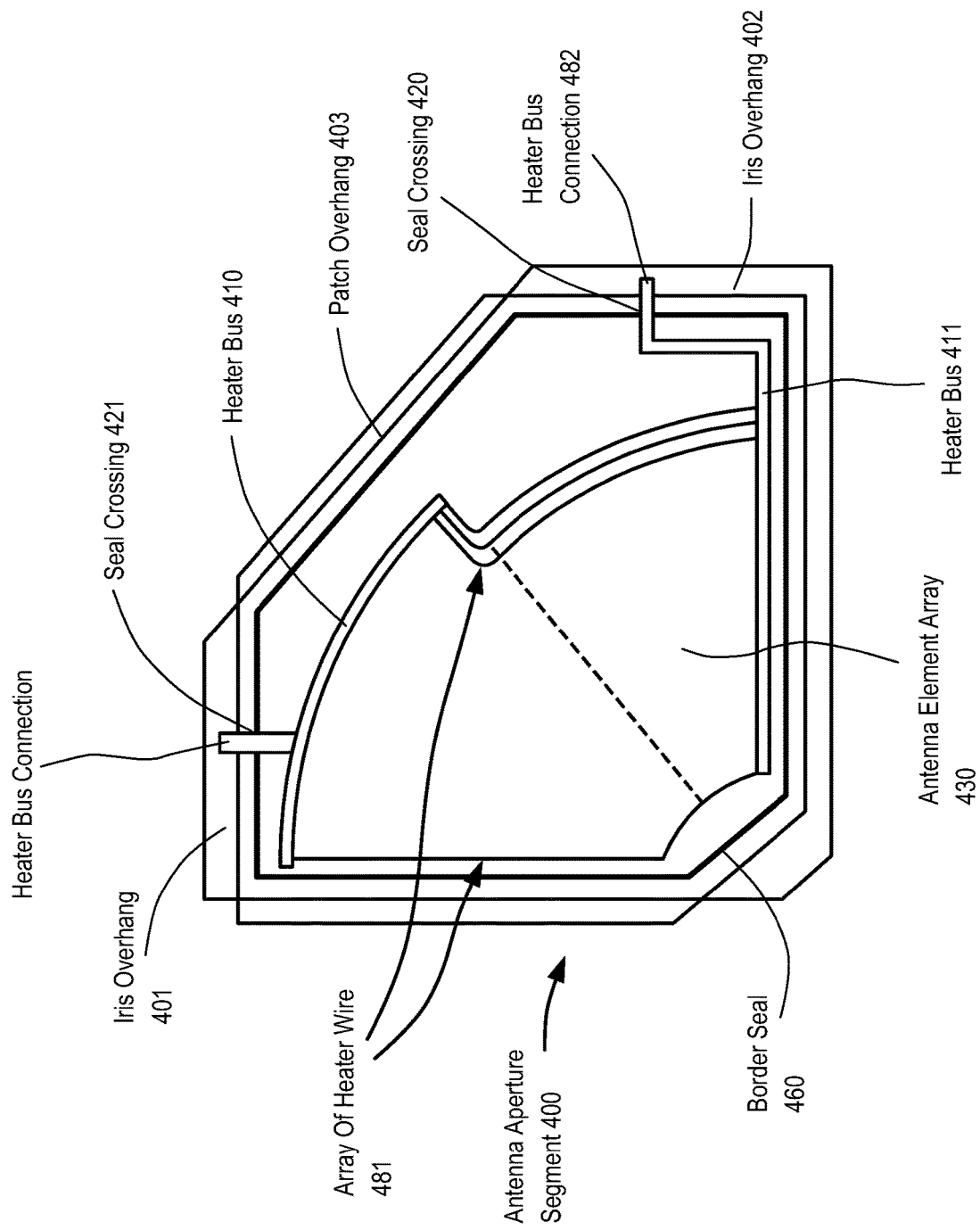
FIG. 4A illustrates an example of heater buses crossing a border seal between layers in an antenna aperture.
Figure 4B:
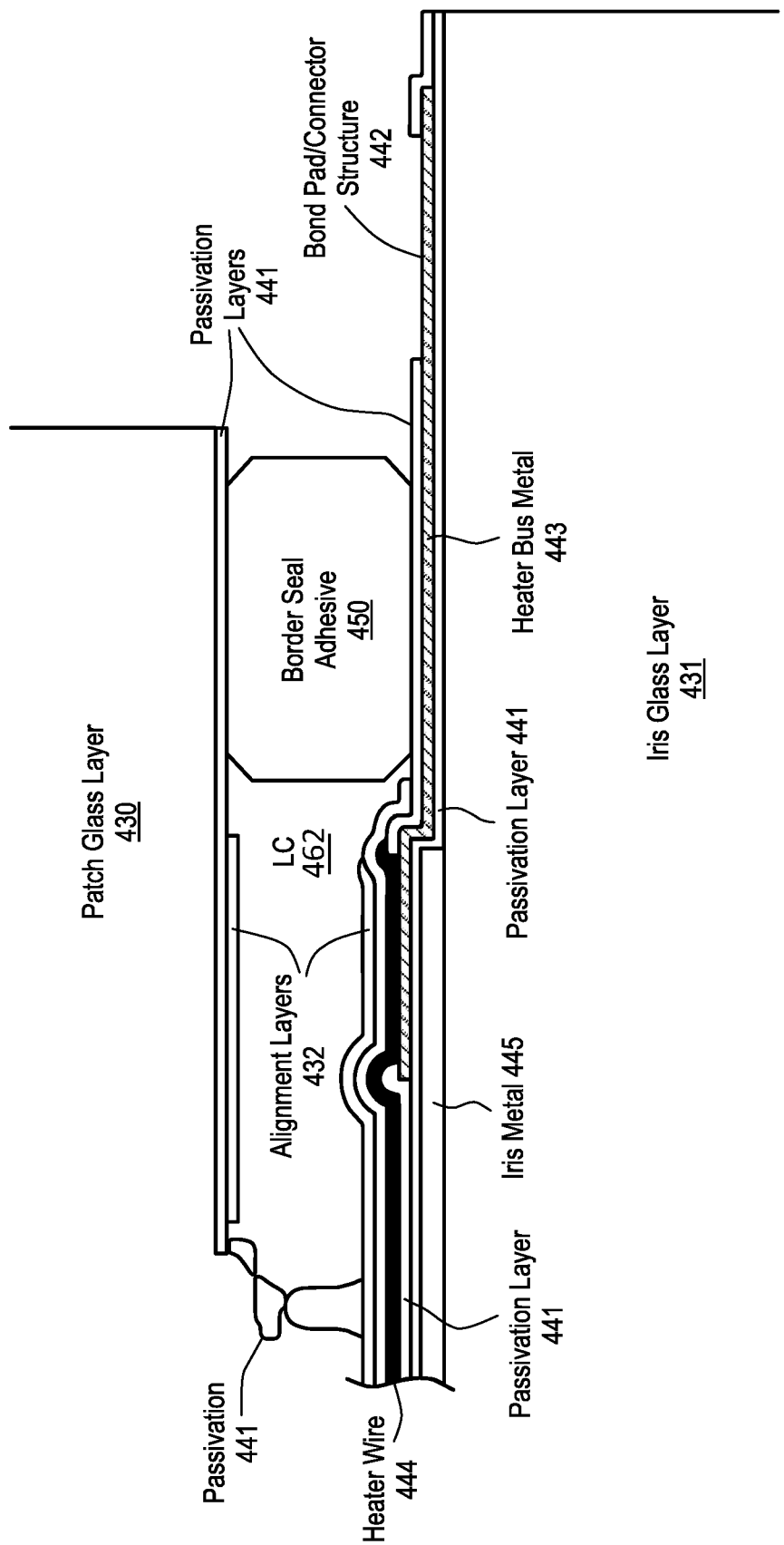
FIG. 4B illustrates a generic cross section of a heater bus connecting to a heater wire inside an antenna aperture, extending under a seal and coming out to the bond pad structure on an iris layer overhang.

FIGS. 4A and 4B illustrate examples of the heater buses coming through the border seal out onto the iris glass layer overhang. In one embodiment, the RF aperture, in this case, is cut so that both the iris glass layer and the patch glass layer have overhang regions (where the substrate has a metallized region not faced by glass layer opposite the metallized face). Note that while the iris and patch layers may be described herein at times as glass layers, they are not limited to being glass and may constitute other types of substrates.

FIG. 4A illustrates a heater bus connection scheme for use in connecting the heater bus to a heater power supply. Referring to FIG. 4A, in one embodiment, the heater power supply (not shown) is located outside of the antenna element array, such as antenna element array 430, which includes the heater wires. Antenna aperture segment 400 includes a patched layer and an iris layer as discussed herein. A portion of the iris layer, referred to as iris overhang 401 and 402 extends over portions of the patch layer. Similarly, a portion of the patch glass layer, referred to herein as the patch overhang 403, extends beyond a part of the iris glass layer. The iris glass layer and the patch glass layer are sealed together with liquid crystal material LC 462, by an aperture border seal 460. Heater power bus 410 crosses border seal 460 at seal crossing 421. Heater bus 411 crosses border seal 460 at seal crossing 420 and connects to a power supply. In both cases, heater power bus 410 and heater bus 411 are able to connect through a power supply by exiting antenna aperture segment 400. Antenna aperture segment 400 includes heater power buses 410 and 411 electrically connected to heater wires 481 in the antenna element array 430.

FIG. 4B is a generic cross section of a heater bus connecting to a heater wire inside the aperture, extending under the seal and coming out to the bond pad structure on the iris overhang. Referring to FIG. 4B, heater bus metal 443 goes under a border seal, border seal adhesive 450, on the iris glass layer 431 on top of passivation layer 441. Thus, heater bus metal 443 is underneath border seal adhesive 450. Border seal adhesive 450 couples the patch glass layer 430 to iris glass layer 431 including the fabricated layers thereon.

Heater wire 444 is deposited on top of passivation layer 441 and a portion of heater bus metal 443, thereby electrically connecting to heater bus metal 443 with heater wire 444. Heater wire 444 is fabricated on a portion of passivation layer 441 that is fabricated on top of iris metal 445 and is fabricated onto a portion of heater bus metal 443. In an alternative embodiment, there is a passivation layer between heater bus metal 443 and heater wire 444 with a via through the passivation layer connecting heater bus metal 443 and heater wire 444.

Passivation layer 441 is fabricated on top of heater wire 444 and at least a portion of heater bus metal 443. An alignment layer 432 is fabricated on top of passivation layer 441. Passivation layer 441 is also fabricated on the bottom of the patch glass layer 430. Similarly, alignment layer 432 is fabricated over a portion of passivation layer 441 on the patch glass layer 430. Note that while heater wire 444 is shown deposited directly on top of heater bus metal 443 without a passivation layer and via in between, in an alternative embodiment, another layer of passivation is deposited between heater wire 444 and heater bus metal 443 with an electrical connection between the two being made using a via. This layer of passivation protects the heater bus metal while the heater wire metal is being etched.

Bond pad/connector structure 442 is a location to electrically connect the power supply to heater bus metal 443.

The power for the heater buses may cross from the patch glass layer side of the aperture to the iris glass layer side of the aperture inside of the border seal, within the border seal itself, or outside of the border seal. Bringing the heater buses out to the patch layer overhang has the advantage of possibly making the heater connection within the connector used for the rest of the interface lines from the controller electronics to the aperture. The following illustrations show methods of doing this inside and within the border seal.

Figure 5:
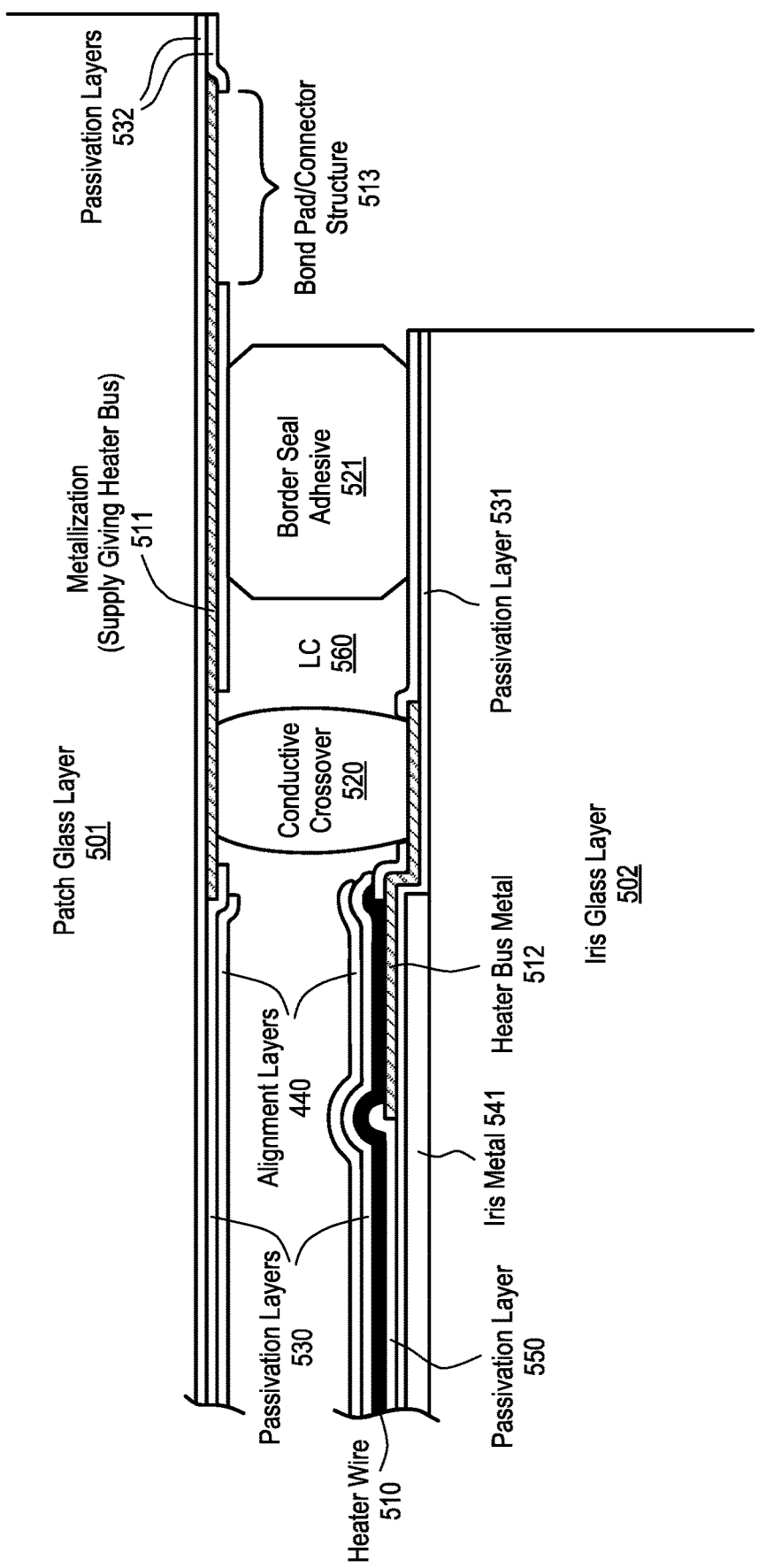
FIG. 5 illustrates a heater bus electrical crossover from an iris layer to a patch layer inside a border seal.

FIG. 5 illustrates on embodiment of a heater power bus electrically crossing over from iris layer to the patch layer inside a border seal. Referring to FIG. 5, patch glass layer 501 is shown over iris glass layer 502. There are a number of layers fabricated onto patch glass layer 501 and iris glass layer 502 and a border seal adhesive 521 couples these two substrates together and seals in LC 560 between the two substrates. In one embodiment, patch glass layer 501 and iris glass layer 502 comprise glass layers, though they may be other types of substrates.

Iris metal layer 541 is fabricated on top of iris glass layer 502. Passivation layer 531 is fabricated on top of iris metal layer 541 and the iris glass layer 502 where iris metal layer 541 is absent (e.g., has been etched away). Over passivation layer 531 comprises heater bus metal 512. Over the passivation layer 531 that is over iris metal layer 541 is passivation layer 550. Heater wire 510, for heating LC 560, is fabricated on top of passivation layer 550 and on top of a portion of heater bus metal 512. In an alternative embodiment, there is a passivation layer between heater bus metal 512 and heater wire 510 with a via through the passivation layer connecting heater bus metal 512 and heater wire 510. Passivation layer 530 is fabricated over heater wire 510 or at least a portion of heater wire 510, with alignment layer 440 on top of passivation layer 530. On patch glass layer 501, a passivation layer 532 is fabricated. On top of passivation layer 532 is a metallization 511 supplying the heater bus. A passivation layer 530 covers a portion of heater bus metallization 511, while alignment layer 440 covers a portion of passivation layers 530 and is used for aligning LC 560. A bond/connector structure 513 is located to allow an electrical connection between the heater power bus and an external power supply (not shown).

Conductive cross-over 520 electrically connects the heater bus metallization 511 to heater bus metal 512 such that the power supply connected to connector structure 513 is able to supply power through heater bus metallization 511 through the conductor cross-over 520 to heater bus metal 512 which provides the power to heater wire 510.

Figure 6:
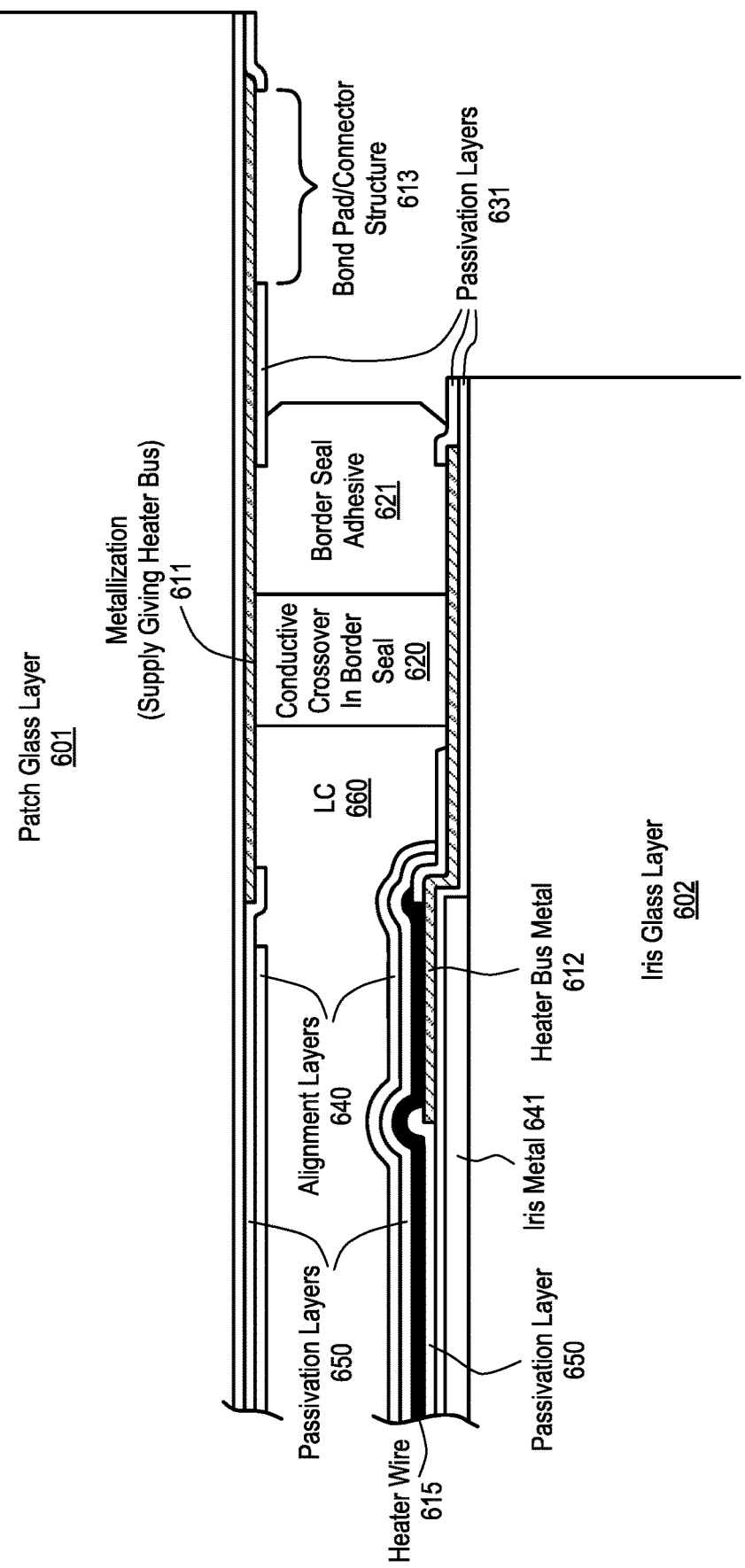
FIG. 6 illustrates a heater bus electrical cross over from an iris layer to a patch layer within a border seal structure.

FIG. 6 illustrates one embodiment of a heater bus electrical cross-over from the iris layer to the patch layer within a border seal structure. Referring to FIG. 6, a conductive cross-over 620 is with the border seal 621 and provides an electrical connection between the heater bus metal 611 that is fabricated on the patch glass layer 601 to heater bus 612, which is on the iris glass layer 602. Liquid crystal material LC 660, for tuning the metamaterial antenna, is held between the patch glass layer 601 and the iris glass layer 602. Heater wire 615, for heating LC 660, is fabricated on a portion of passivation layer 650 that is fabricated on top of iris metal 641 and is fabricated onto a portion of heater bus metal 612. In an alternative embodiment, there is a passivation layer between heater bus 612 and heater wire 615 with a via through the passivation layer connecting heater bus 612 and heater wire 615.

A patch overhang has no facing iris glass outside the border seal. An iris under hang has no facing patch glass outside the border seal. Metallization on an overhang or under hang is therefore accessible to make a connection to the heater power supply/controller. For example, this connection might be made by an ACF (anisotropic conductive adhesive) to a flex cable. This flex cable might connect to the heater power supply/controller. This heater power supply/controller might be on the aperture controller board or might be an independent power supply/controller unit.

Note that in the figures the patch glass, especially around the border seal region, has a number of other structures on it besides this heater wiring. The heater connection structures as drawn focus only on a method of supplying the heaters, and do not try to show the integration with other patch structures, for example, the voltage bus that connects from the patch overhang to the iris metal. A layer of passivation above the heater bus metallization 511 (in FIG. 5) and 611 (in FIG. 6), isolates this heater supply metallization from the rest of the patch circuitry.

Placement of the Heater Wiring, Heater Buses and Connections

The heater wiring and heater buses might be placed on either the patch glass side of the aperture, the iris glass side of the aperture, or have may have parts on both patch and iris glass (or non-glass) layers of the aperture. The connection for the heaters may come out on the patch glass layer or the iris glass layer side of the aperture.

Temperature Sensors Inside the RF Aperture

In one embodiment, one or more temperature sensors are located within the aperture. These temperature sensors are used to monitor the internal aperture temperature and to control whether the heater, including the heater elements (wires), heater buses and heater connections need to be engaged to regulate the temperature in the aperture. This may be necessary where the RF antenna elements need to be put in a certain temperature or range of temperatures. For example, when each of the RF antenna elements includes an LC, the antenna element operates more effectively if the LC is at a certain temperature. Therefore, by monitoring the temperature within the aperture and determining that the temperature of the LC is below its optimal temperature range, the heater wires, buses and connections can be used to heat the internal aperture until the LC is at the desired temperature range.

Using an Antenna Element Control Transistor (e.g., TFT) for Aperture Temperature Measurement Embodiments of the invention include techniques for using a transistor, e.g., a thin film transistor (TFT), integrated onto the patch layer substrate to measure LC temperature. In one embodiment, this technique uses the changing mobility characteristics of the TFT over temperature to indicate the temperature.

Figure 7A:
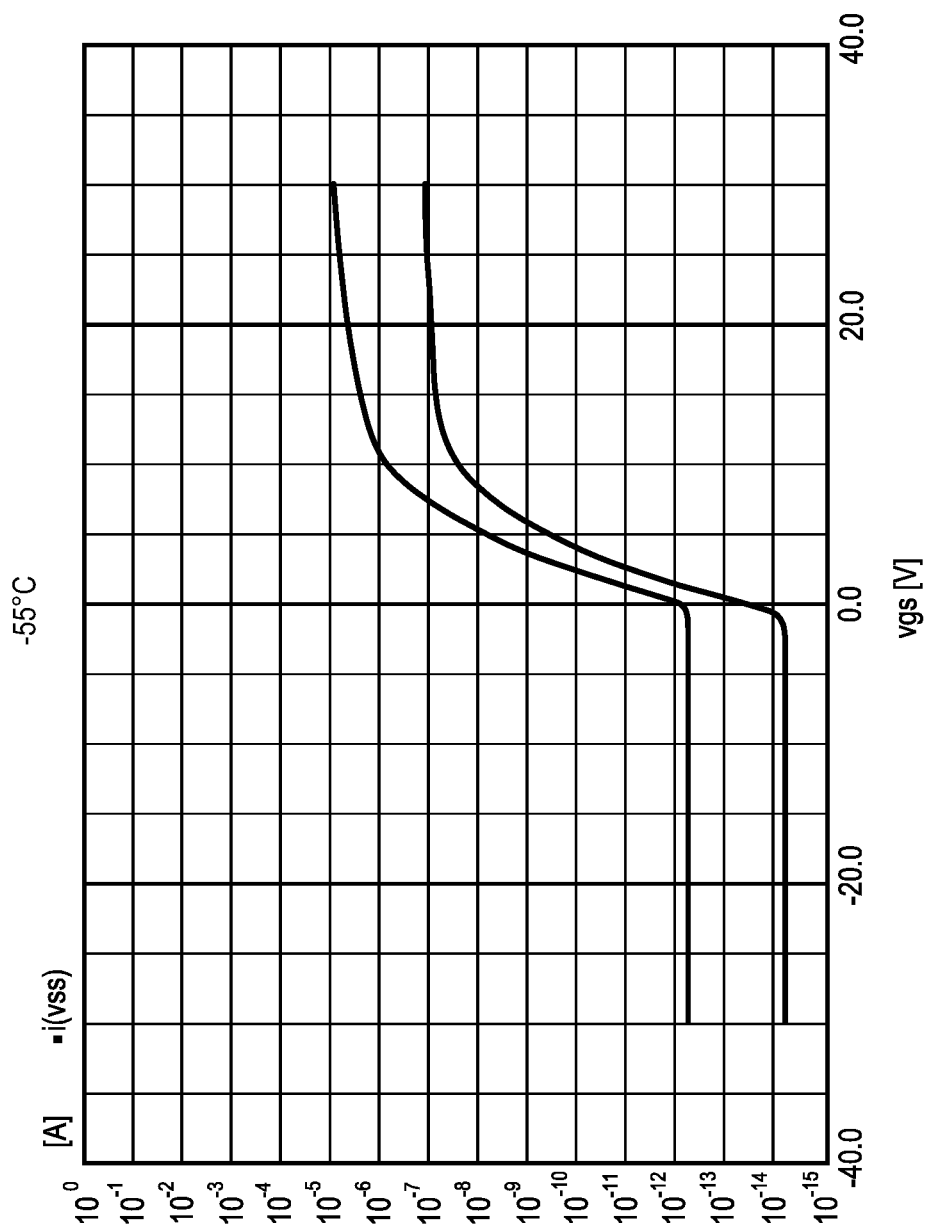
FIGS. 7A-7C illustrate typical thin-film transistor (TFT) current (I)-voltage (V) curve at various temperatures.
Figure 7B:
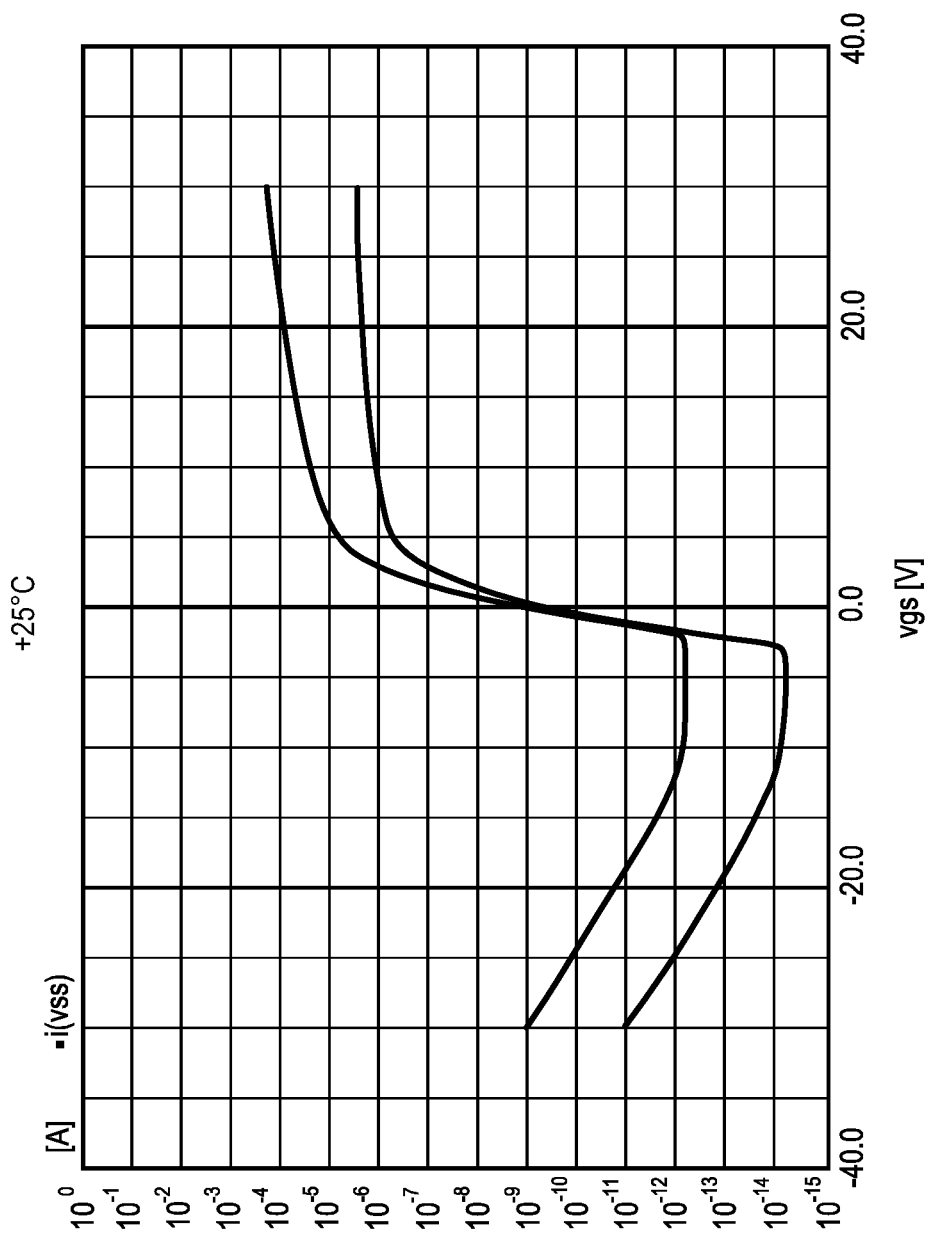
Figure 7C:
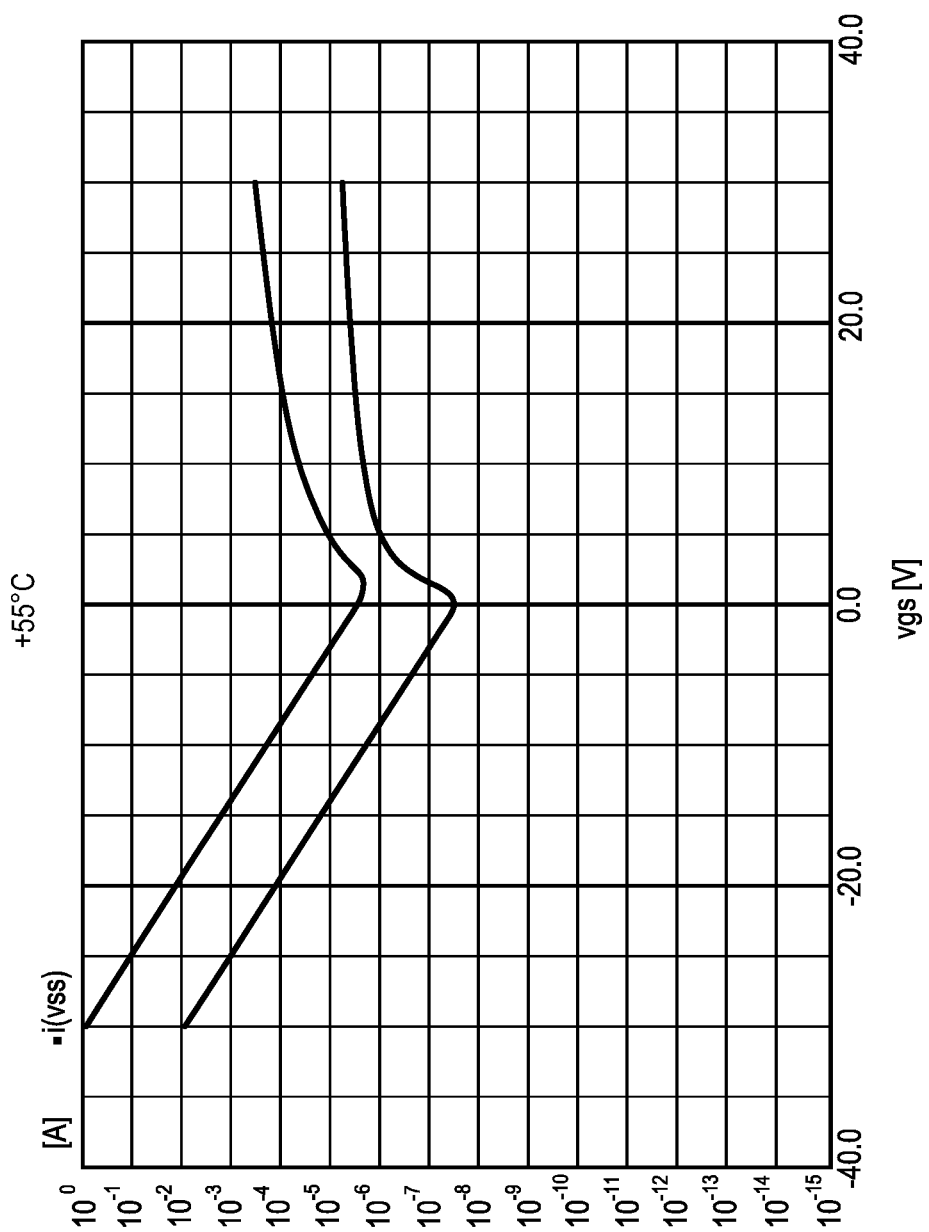

FIGS. 7A-7C are typical TFT Voltage vs Current curves at different temperatures. Referring to FIGS. 7A-7C, each chart has a plot for two values of Vds where the vertical axis is Id, the horizontal axis is Vgs.

Note that Id for a given Vds and Vgs changes over temperature. By using this TFT characteristic and setting the Vgs and Vds to known constant values, the measured Id value can be correlated to the temperature of the TFT.

Figure 8A:
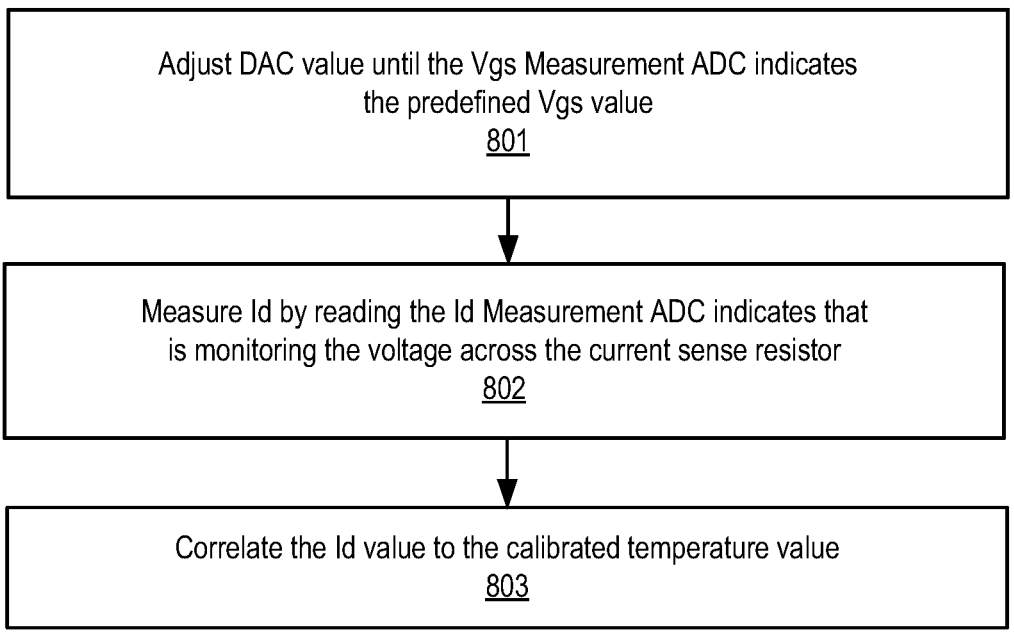
FIG. 8A is a flow diagram of one embodiment of a process for determining an estimate of temperature of the LC using a TFT (or other type of transistor).

FIG. 8A is a flow diagram of one embodiment of a process for determining an estimate of temperature of the LC using a TFT (or other type of transistor). The TFT is connected to the LC. Therefore, the temperature of the TFT provides an indication of the temperature of the LC. The process is performed by a temperature control system that includes a temperature monitoring subsystem.

Referring to FIG. 8A, the process begins by adjusting a digital voltage value, referred to as the digital-to-analog converter (DAC) value, until the voltage Vgs measurement analog-to-digital converter (ADC) indicates the predefined Vgs value (processing block 801). Next, processing logic in the temperature control system measures the current Id by reading the Id measurement ADC that is monitoring the voltage across a current sense resistor (processing block 802). Based on the Vgs voltage value and the Id current value, processing logic correlates the Id value to the calibrated temperature value (processing block 803). The correlation may be performed by a correlator/processing unit (e.g., processor) that access a lookup table (LUT) using the values to determine a corresponding temperature value for the TFT.

Figure 8C:
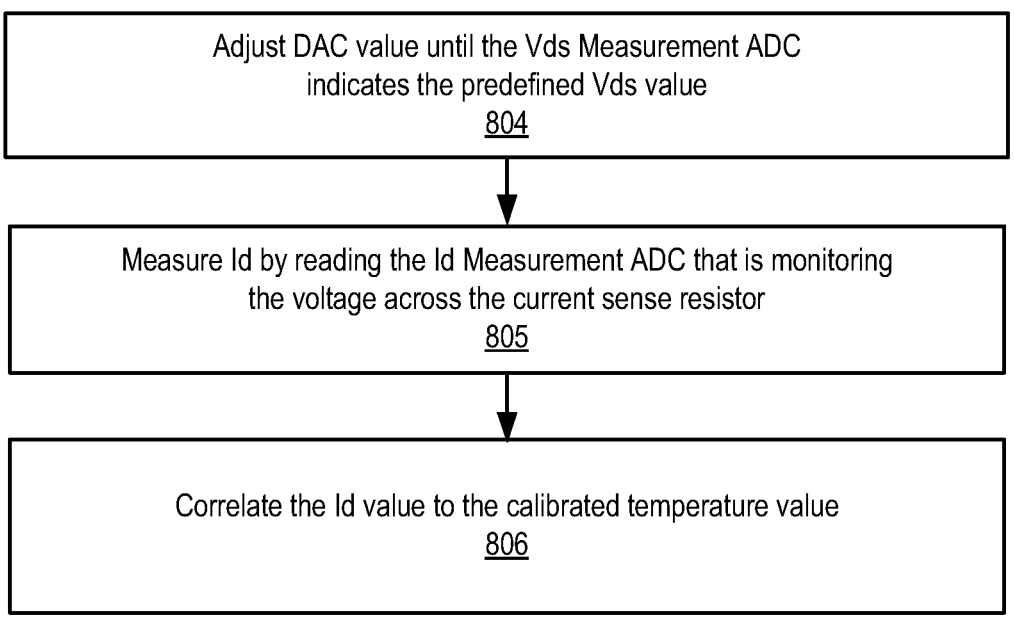
FIG. 8C is a flow diagram of one embodiment of a process for determining an estimate of temperature of the LC using a TFT (or other type of transistor).
Figure 8B:
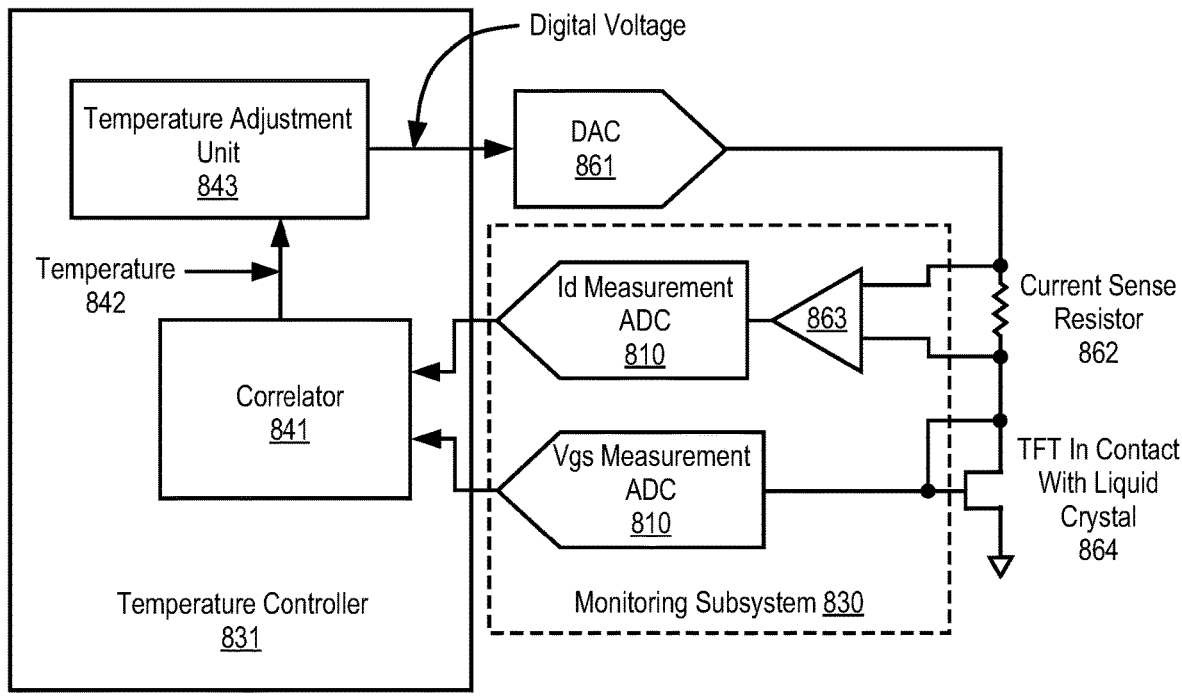
FIG. 8B is a circuit arrangement for measuring voltage and current for use in determining temperature within an antenna aperture.

FIG. 8B illustrates an example of a temperature measurement circuitry. Referring to FIG. 8B, a voltage value is provided by DAC 861 to a circuit having current sensor resistor 862 coupled in series with a transistor 864. In one embodiment, a transistor 864 is in contact with liquid crystal (LC) in the RF antenna element. In one embodiment, transistor 864 comprises a thin film transistor (TFT). In one embodiment, the voltage value output from DAC 861 comes from a temperature controller 831. In one embodiment, a temperature adjustment unit 843 may provide different voltage values based on the type of transistor being monitored.

The voltage value across current sensor resistor 862 is monitored using comparator 863 to produce a current measurement that is converted to digital form by ADC 810. Based on the measurement current and the measured Vgs voltage, correlator 841 determines the temperature 842 of transistor 864 based on a correlation between transistor 864 and the measured current Id and Vgs voltage (processing block 803). Since transistor 864 is in contact with the LC, the temperature of transistor 864 is used to indicate or represent the temperature of the LC.

FIG. 8C is a flow diagram of one embodiment of a process for determining an estimate of temperature of the LC using a TFT (or other type of transistor) configured in a different manner than that of FIG. 8A. As in FIG. 8A, the TFT is connected to the LC and the temperature of the TFT provides an indication of the temperature of the LC. The process is performed by a temperature control system that includes a temperature monitoring subsystem.

Referring to FIG. 8C, the process begins by adjusting a digital voltage value, referred to as the digital-to-analog converter (DAC) value, until the voltage Vds measurement analog-to-digital converter (ADC) indicates the predefined Vds value (processing block 804). Next, processing logic in the temperature control system measures the current Id by reading the Id measurement ADC that is monitoring the voltage across a current sense resistor (processing block 805). Based on the Vds voltage value and the Id current value, processing logic correlates the Id value to the calibrated temperature value (processing block 806). The correlation may be performed by a correlator/processing unit (e.g., processor) that access a lookup table (LUT) using the values to determine a corresponding temperature value for the TFT.

Figure 8D:
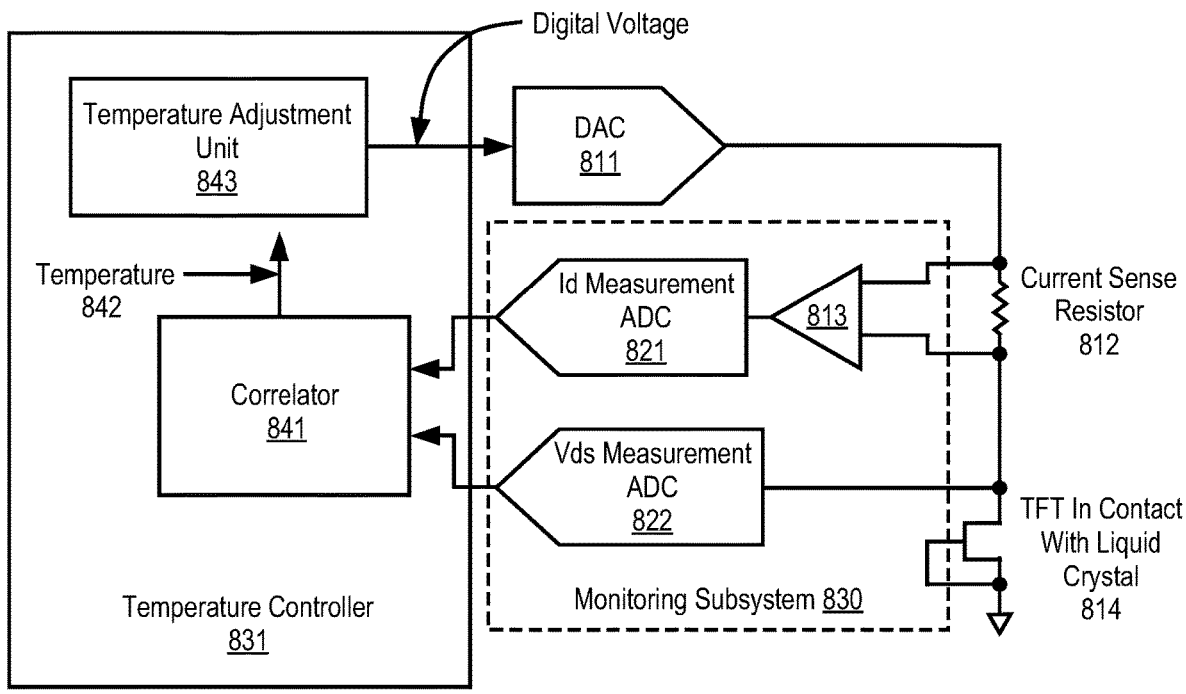
FIG. 8D is another circuit arrangement for measuring voltage and current for use in determining temperature within an antenna aperture.

FIG. 8D illustrates another example of a temperature monitoring circuit for a TFT using the procedure of FIG. 8C. The circuit in FIG. 8D is substantially similar to that of FIG. 8B with the exception that transistor 814 is coupled in a different way. Thus, the measuring by the monitoring subsystem and the operation of temperature controller 831 operates in the same way.

In one embodiment, multiple test TFTs can be distributed around the RF elements (and their LC) in the antenna array to measure the temperature at various locations and/or for temperature averaging.

Using Capacitance Properties of the LC to Measure LC Temperature

In one embodiment, LC temperature is measured by using the capacitance properties of the LC. This uses the characteristic of the LC that the electrical capacitance changes as a function of temperature.

In one embodiment, an electrical test capacitor is made by placing a conductive surface on the patch glass layer and a matching conductive surface be placed on the iris glass layer, thereby creating a capacitor with the LC acting as the separating dielectric material. These conductive surfaces are connected to circuitry that measures the capacitance (such as a capacitance-to-digital converter (CDC)). Since the capacitance of the LC is a function of temperature, the capacitance of the test capacitor can be correlated to the temperature of the LC directly.

Figure 9:
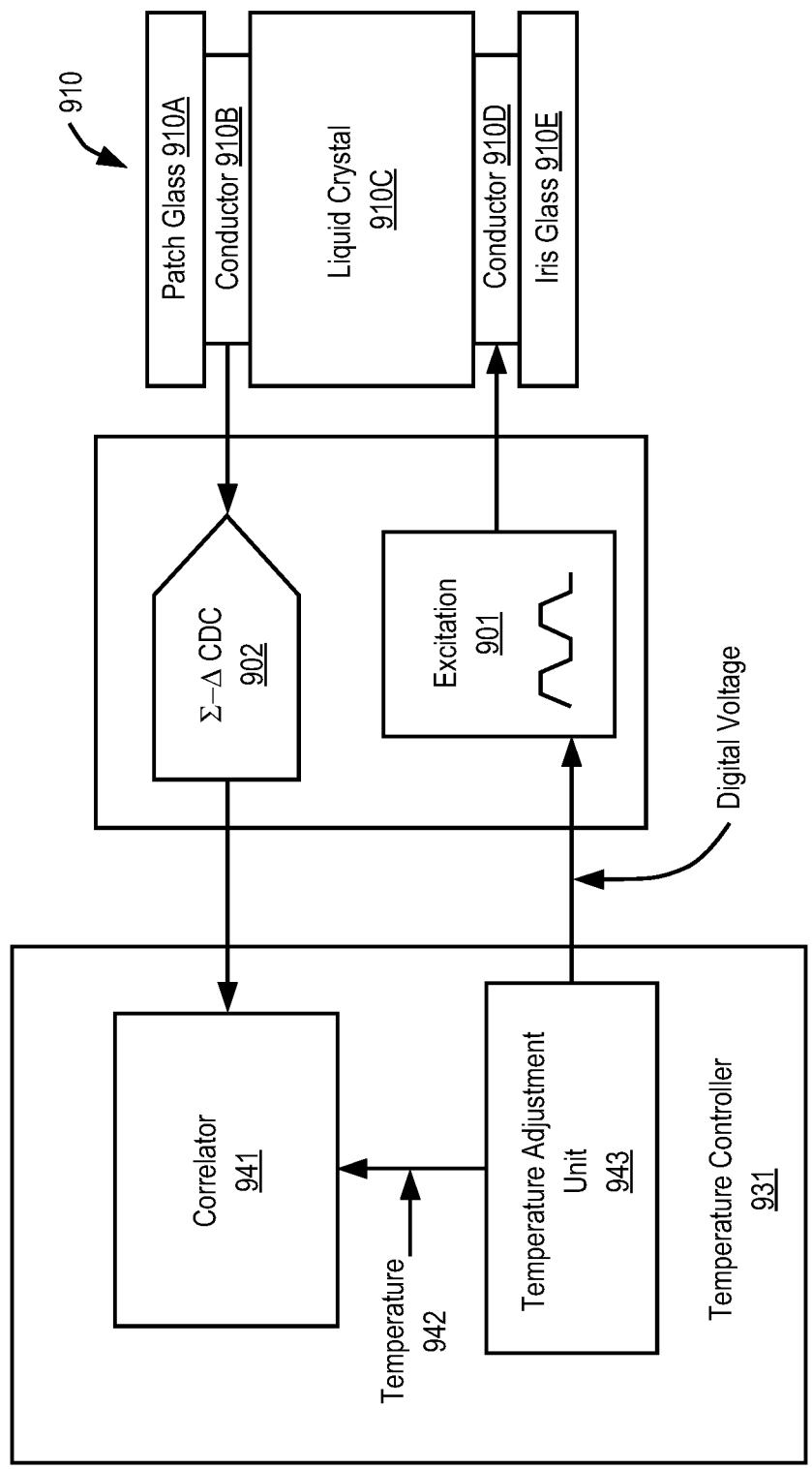
FIG. 9 illustrates an arrangement for measuring capacitance of liquid crystal.

FIG. 9 illustrates a circuit to determine the capacitance of the LC in order to determine the temperature of the LC in the RF antenna elements. Referring to FIG. 9, an excitation signal 901 is provided to a conductor 910D that connects iris glass layer 910E to liquid crystal 910C. In one embodiment, the excitation is a square wave. In one embodiment, the excitation signal 901 comes from a DAC with an input provided temperature controller 931. In one embodiment, a temperature adjustment unit 943 may provide different voltage values based on the type of test capacitor being monitored.

Patch glass layer 910A is coupled to liquid crystal 910C using conductor 910B. Applying the square wave of signal 901 to conductor 910D causes a capacitance to be created over liquid crystal 910C that is measured with $\Sigma$-$\Delta$ digital converter (CDC) 902. The output of CDC 902 is provided to temperature controller 931, which correlates the capacitance measurement, using correlator 941, to a temperature 942 of the LC of the LC-based test capacitor. This temperature is then used as the temperature of the LCs in the RF antenna elements in the array.

In yet another embodiment, the temperature monitoring subsystem is operable to measure decay speed of a liquid crystal and correlate the decay speed to a temperature of the liquid crystal. The decay speed of an LC is well-known in the art and the amount of time an LC is used is easily tracked. In one embodiment, the correlation operation is performed in the same manner as described above in conjunction with FIGS. 8B, 8D and 9.

In one embodiment, multiple test patches are distributed around the antenna array of RF LC-based antenna elements to measure the temperature various location and/or for temperature averaging.

The heater, including the heater elements and heater buses, is operated in conjunction with a temperature sensor to provide feedback to the heater system. The temperature sensor may be in the aperture or on the aperture. Some correlation of the temperature inside the aperture and the temperature measured by the sensor may need to be established by a calibration procedure.

In one embodiment, the temperature of the aperture is regulated by a control loop consisting of the temperature sensor and the heater power supply/controller. When the sensor indicates that the aperture is below its operational temperature, the heater power controller causes the heater to turn on to heat the aperture. There are many methods by which the desired aperture temperature can be controlled using the heater structures described herein.

In an alternative embodiment, instead of placing the heater inside of the RF aperture, the same types of heater wire patterns, heater wire pattern placement, heater buses and heater bus placements are made on a superstrate. In one embodiment, the superstrate is a substrate directly on the satellite facing side of the RF aperture. In one embodiment, the implementation is the same as is described above for use within the RF aperture (in the RF element/LC plane).

In one embodiment, when placing the heater on the superstrate, the superstrate is placed with the heater wire pattern between the top of the patch layer and the bottom of the superstrate, as close to the LC layer as possible. One potential problem with placing the heater on the superstrate is that the interaction of RF coming from the patch layer with the heater wires on the superstrate may have a detrimental effect on the RF pattern being formed by the RF aperture. To reduce the interaction of the RF with the heater wires, in one embodiment, the patch layer is thinned as much as possible, to move the heater as close to the RF element/LC plane as possible.

Figure 21A:
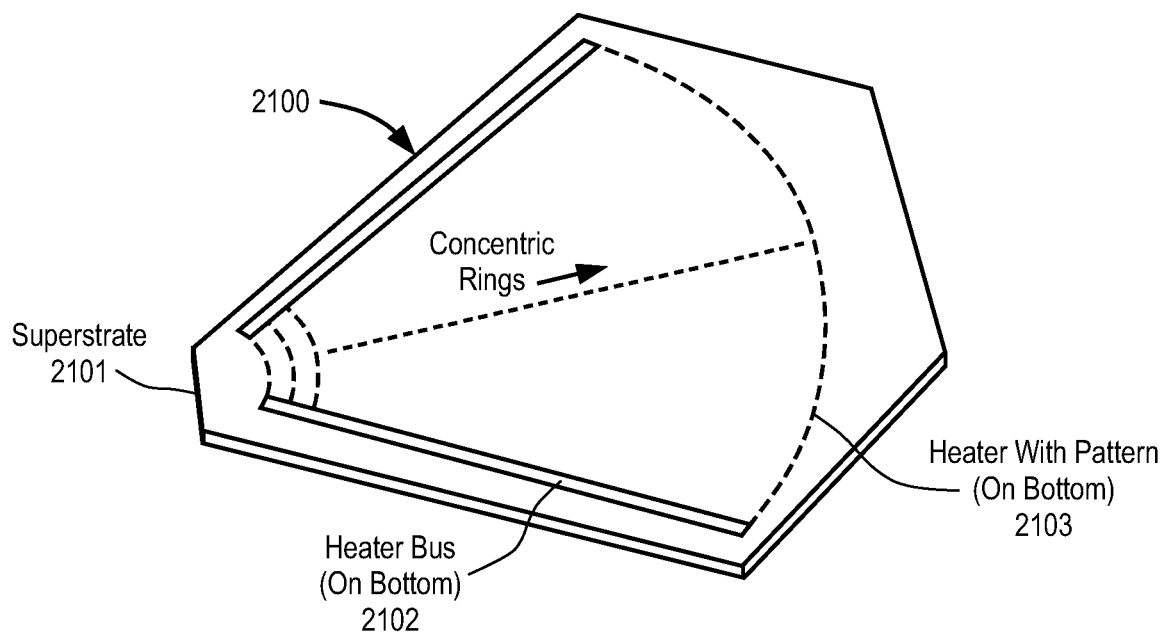
FIG. 21A and FIG. 21B illustrate one embodiment of a superstrate having heating elements for heating inside an antenna aperture.
Figure 21B:
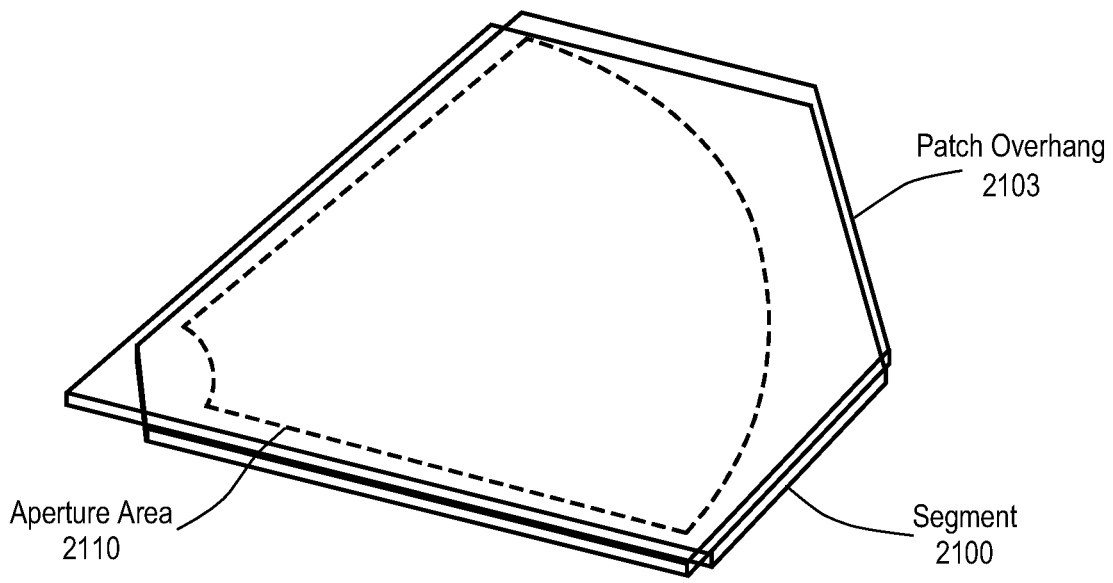

FIGS. 21A and 21B illustrate an example of a superstrate with a heater pattern attached thereto. Referring to FIGS. 21A and 21B superstrate 2101 includes a heater wire pattern 2103 on its bottom side. A heater bus 2102 is also attached to the bottom of superstrate 2101. Superstrate 2101 is coupled to segment 2100 that includes aperture area 2110 of RF antenna elements as shown in FIG. 21B, a patch overhang 2103.

Examples of Antenna Embodiments

The techniques described above may be used with flat panel antennas. Embodiments of such flat panel antennas are disclosed. The flat panel antennas include one or more arrays of antenna elements on an antenna aperture. In one embodiment, the antenna elements comprise liquid crystal cells. In one embodiment, the flat panel antenna is a cylindrically fed antenna that includes matrix drive circuitry to uniquely address and drive each of the antenna elements that are not placed in rows and columns. In one embodiment, the elements are placed in rings.

In one embodiment, the antenna aperture having the one or more arrays of antenna elements is comprised of multiple segments coupled together. When coupled together, the combination of the segments form closed concentric rings of antenna elements. In one embodiment, the concentric rings are concentric with respect to the antenna feed.

Overview of an Example of Antenna Systems

In one embodiment, the flat panel antenna is part of a metamaterial antenna system. Embodiments of a metamaterial antenna system for communications satellite earth stations are described. In one embodiment, the antenna system is a component or subsystem of a satellite earth station (ES) operating on a mobile platform (e.g., aeronautical, maritime, land, etc.) that operates using either Ka-band frequencies or Ku-band frequencies for civil commercial satellite communications. Note that embodiments of the antenna system also can be used in earth stations that are not on mobile platforms (e.g., fixed or transportable earth stations).

In one embodiment, the antenna system uses surface scattering metamaterial technology to form and steer transmit and receive beams through separate antennas. In one embodiment, the antenna systems are analog systems, in contrast to antenna systems that employ digital signal processing to electrically form and steer beams (such as phased array antennas).

In one embodiment, the antenna system is comprised of three functional subsystems: (1) a wave guiding structure consisting of a cylindrical wave feed architecture; (2) an array of wave scattering metamaterial unit cells that are part of antenna elements; and (3) a control structure to command formation of an adjustable radiation field (beam) from the metamaterial scattering elements using holographic principles.

Examples of Wave Guiding Structures

Figure 10:
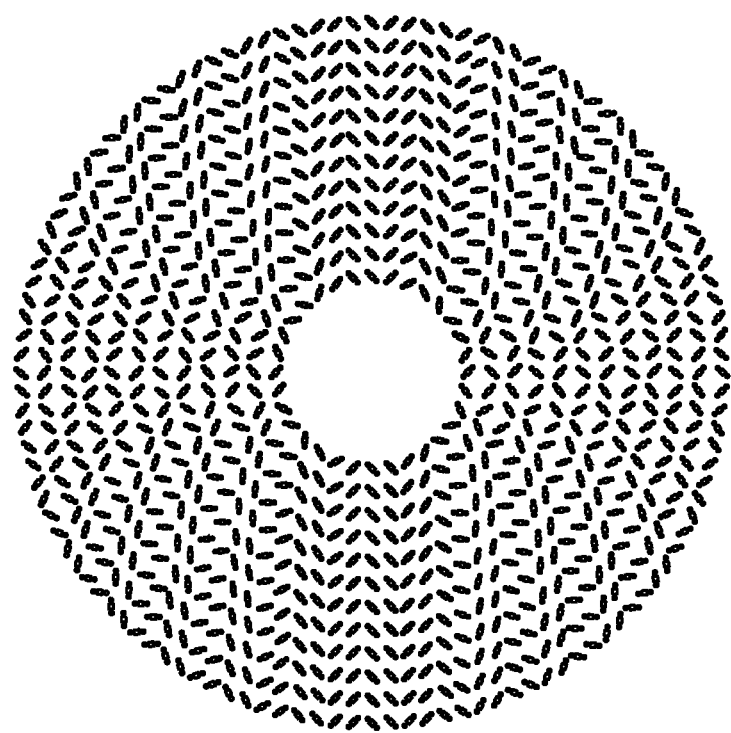
FIG. 10 illustrates an aperture having one or more arrays of antenna elements placed in concentric rings around an input feed of the cylindrically fed antenna.

FIG. 10 illustrates an aperture having one or more arrays of antenna elements placed in concentric rings around an input feed of the cylindrically fed antenna. In one embodiment, the cylindrically fed antenna includes a coaxial feed that is used to provide a cylindrical wave feed. In one embodiment, the cylindrical wave feed architecture feeds the antenna from a central point with an excitation that spreads outward in a cylindrical manner from the feed point. That is, a cylindrically fed antenna creates an outward travelling concentric feed wave. Even so, the shape of the cylindrical feed antenna around the cylindrical feed can be circular, square or any shape. In another embodiment, a cylindrically fed antenna creates an inward travelling feed wave. In such a case, the feed wave most naturally comes from a circular structure.

Antenna Elements

In one embodiment, the antenna elements comprise a group of patch antennas. This group of patch antennas comprises an array of scattering metamaterial elements. In one embodiment, each scattering element in the antenna system is part of a unit cell that consists of a lower conductor, a dielectric substrate and an upper conductor that embeds a complementary electric inductive-capacitive resonator ("complementary electric LC" or "CELC") that is etched in or deposited onto the upper conductor. As would be understood by those skilled in the art, LC in the context of CELC refers to inductance-capacitance, as opposed to liquid crystal.

In one embodiment, a liquid crystal (LC) is disposed in the gap around the scattering element. This LC is driven by the direct drive embodiments described above. In one embodiment, liquid crystal is encapsulated in each unit cell and separates the lower conductor associated with a slot from an upper conductor associated with its patch. Liquid crystal has a permittivity that is a function of the orientation of the molecules comprising the liquid crystal, and the orientation of the molecules (and thus the permittivity) can be controlled by adjusting the bias voltage across the liquid crystal. Using this property, in one embodiment, the liquid crystal integrates an on/off switch for the transmission of energy from the guided wave to the CELC. When switched on, the CELC emits an electromagnetic wave like an electrically small dipole antenna. Note that the teachings herein are not limited to having a liquid crystal that operates in a binary fashion with respect to energy transmission.

In one embodiment, the feed geometry of this antenna system allows the antenna elements to be positioned at forty five degree (45°) angles to the vector of the wave in the wave feed. Note that other positions may be used (e.g., at 40° angles). This position of the elements enables control of the free space wave received by or transmitted/radiated from the elements. In one embodiment, the antenna elements are arranged with an inter-element spacing that is less than a free-space wavelength of the operating frequency of the antenna. For example, if there are four scattering elements per wavelength, the elements in the 30 GHz transmit antenna will be approximately 2.5 mm (i.e., ¼th the 10 mm free-space wavelength of 30 GHz).

In one embodiment, the two sets of elements are perpendicular to each other and simultaneously have equal amplitude excitation if controlled to the same tuning state. Rotating them +/−45 degrees relative to the feed wave excitation achieves both desired features at once. Rotating one set 0 degrees and the other 90 degrees would achieve the perpendicular goal, but not the equal amplitude excitation goal. Note that 0 and 90 degrees may be used to achieve isolation when feeding the array of antenna elements in a single structure from two sides.

The amount of radiated power from each unit cell is controlled by applying a voltage to the patch (potential across the LC channel) using a controller. Traces to each patch are used to provide the voltage to the patch antenna. The voltage is used to tune or detune the capacitance and thus the resonance frequency of individual elements to effectuate beam forming. The voltage required is dependent on the liquid crystal mixture being used. The voltage tuning characteristic of liquid crystal mixtures is mainly described by a threshold voltage at which the liquid crystal starts to be affected by the voltage and the saturation voltage, above which an increase of the voltage does not cause major tuning in liquid crystal. These two characteristic parameters can change for different liquid crystal mixtures.

In one embodiment, as discussed above, a matrix drive is used to apply voltage to the patches in order to drive each cell separately from all the other cells without having a separate connection for each cell (direct drive). Because of the high density of elements, the matrix drive is an efficient way to address each cell individually.

In one embodiment, the control structure for the antenna system has 2 main components: the antenna array controller, which includes drive electronics, for the antenna system, is below the wave scattering structure, while the matrix drive switching array is interspersed throughout the radiating RF array in such a way as to not interfere with the radiation. In one embodiment, the drive electronics for the antenna system comprise commercial off-the shelf LCD controls used in commercial television appliances that adjust the bias voltage for each scattering element by adjusting the amplitude or duty cycle of an AC bias signal to that element.

In one embodiment, the antenna array controller also contains a microprocessor executing the software. The control structure may also incorporate sensors (e.g., a GPS receiver, a three axis compass, a 3-axis accelerometer, 3-axis gyro, 3-axis magnetometer, etc.) to provide location and orientation information to the processor. The location and orientation information may be provided to the processor by other systems in the earth station and/or may not be part of the antenna system.

More specifically, the antenna array controller controls which elements are turned off and those elements turned on and at which phase and amplitude level at the frequency of operation. The elements are selectively detuned for frequency operation by voltage application.

For transmission, a controller supplies an array of voltage signals to the RF patches to create a modulation, or control pattern. The control pattern causes the elements to be turned to different states. In one embodiment, multistate control is used in which various elements are turned on and off to varying levels, further approximating a sinusoidal control pattern, as opposed to a square wave (i.e., a sinusoid gray shade modulation pattern). In one embodiment, some elements radiate more strongly than others, rather than some elements radiate and some do not. Variable radiation is achieved by applying specific voltage levels, which adjusts the liquid crystal permittivity to varying amounts, thereby detuning elements variably and causing some elements to radiate more than others.

The generation of a focused beam by the metamaterial array of elements can be explained by the phenomenon of constructive and destructive interference. Individual electromagnetic waves sum up (constructive interference) if they have the same phase when they meet in free space and waves cancel each other (destructive interference) if they are in opposite phase when they meet in free space. If the slots in a slotted antenna are positioned so that each successive slot is positioned at a different distance from the excitation point of the guided wave, the scattered wave from that element will have a different phase than the scattered wave of the previous slot. If the slots are spaced one quarter of a guided wavelength apart, each slot will scatter a wave with a one fourth phase delay from the previous slot.

Using the array, the number of patterns of constructive and destructive interference that can be produced can be increased so that beams can be pointed theoretically in any direction plus or minus ninety degrees (90°) from the bore sight of the antenna array, using the principles of holography. Thus, by controlling which metamaterial unit cells are turned on or off (i.e., by changing the pattern of which cells are turned on and which cells are turned off), a different pattern of constructive and destructive interference can be produced, and the antenna can change the direction of the main beam. The time required to turn the unit cells on and off dictates the speed at which the beam can be switched from one location to another location.

In one embodiment, the antenna system produces one steerable beam for the uplink antenna and one steerable beam for the downlink antenna. In one embodiment, the antenna system uses metamaterial technology to receive beams and to decode signals from the satellite and to form transmit beams that are directed toward the satellite. In one embodiment, the antenna systems are analog systems, in contrast to antenna systems that employ digital signal processing to electrically form and steer beams (such as phased array antennas). In one embodiment, the antenna system is considered a "surface" antenna that is planar and relatively low profile, especially when compared to conventional satellite dish receivers.

Figure 11:
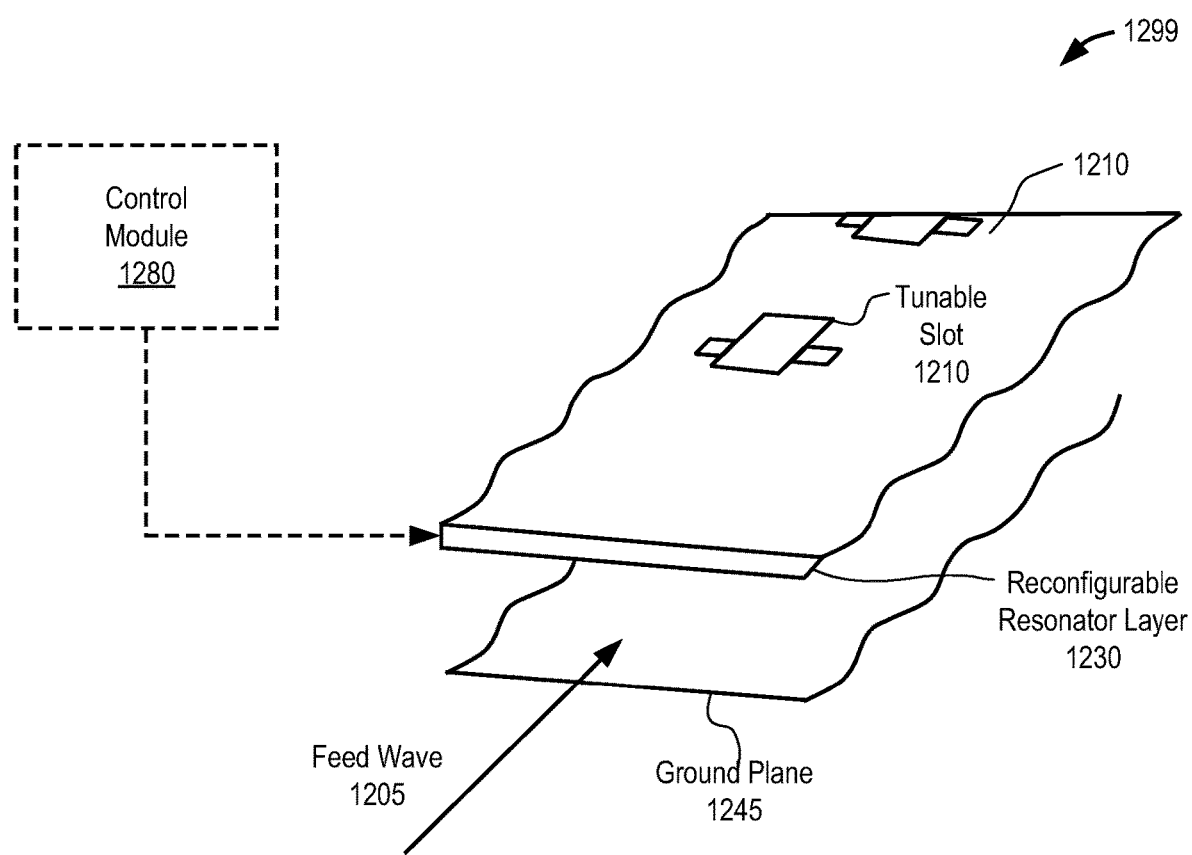
FIG. 11 illustrates a perspective view of one row of antenna elements that includes a ground plane and a reconfigurable resonator layer.

FIG. 11 illustrates a perspective view of one row of antenna elements that includes a ground plane and a reconfigurable resonator layer. Reconfigurable resonator layer 1230 includes an array of tunable resonator/slots 1210. The array of tunable resonator/slots 1210 can be configured to point the antenna in a desired direction. Each of the tunable slots can be tuned/adjusted by varying a voltage across the liquid crystal.

Control module 1280 is coupled to reconfigurable resonator layer 1230 to modulate the array of tunable resonator/slots 1210 by varying the voltage across the liquid crystal in FIG. 11. Control module 1280 may include a Field Programmable Gate Array ("FPGA"), a microprocessor, a controller, System-on-a-Chip (SoC), or other processing logic. In one embodiment, control module 1280 includes logic circuitry (e.g., multiplexer) to drive the array of tunable resonator/slots 1210. In one embodiment, control module 1280 receives data that includes specifications for a holographic diffraction pattern to be driven onto the array of tunable resonator/slots 1210. The holographic diffraction patterns may be generated in response to a spatial relationship between the antenna and a satellite so that the holographic diffraction pattern steers the downlink beams (and uplink beam if the antenna system performs transmit) in the appropriate direction for communication. Although not drawn in each figure, a control module similar to control module 1280 may drive each array of tunable slots described in the figures of the disclosure.

Radio Frequency ("RF") holography is also possible using analogous techniques where a desired RF beam can be generated when an RF reference beam encounters an RF holographic diffraction pattern. In the case of satellite communications, the reference beam is in the form of a feed wave, such as feed wave 1205 (approximately 20 GHz in some embodiments). To transform a feed wave into a radiated beam (either for transmitting or receiving purposes), an interference pattern is calculated between the desired RF beam (the object beam) and the feed wave (the reference beam). The interference pattern is driven onto the array of tunable resonator/slots 1210 as a diffraction pattern so that the feed wave is "steered" into the desired RF beam (having the desired shape and direction). In other words, the feed wave encountering the holographic diffraction pattern "reconstructs" the object beam, which is formed according to design requirements of the communication system. The holographic diffraction pattern contains the excitation of each element and is calculated by $w_{hologram}=w_{in}*w_{out}$, with $w_{in}$ as the wave equation in the waveguide and $w_{out}$ the wave equation on the outgoing wave.

Figure 12:
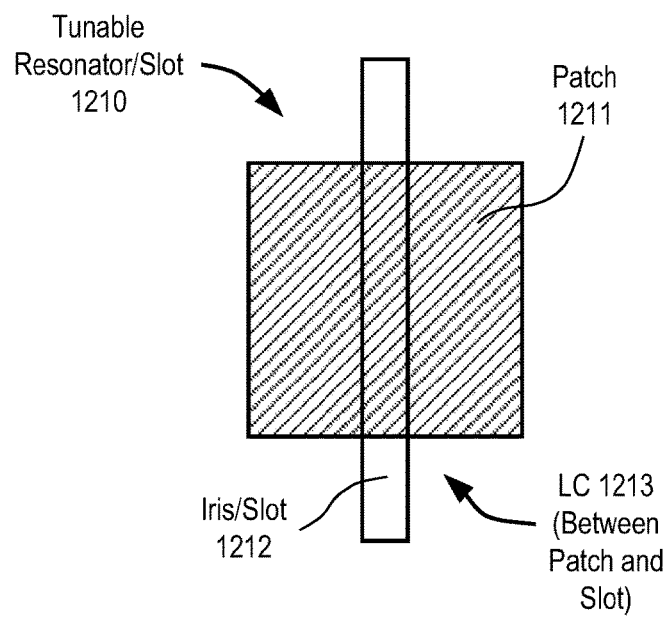
FIG. 12 illustrates one embodiment of a tunable resonator/slot.

FIG. 12 illustrates one embodiment of a tunable resonator/slot 1210. Tunable resonator/slot 1210 includes an iris/slot 1212, a radiating patch 1211, and liquid crystal 1213 disposed between iris/slot 1212 and patch 1211. In one embodiment, radiating patch 1211 is co-located with iris/slot 1212.

Figure 13:
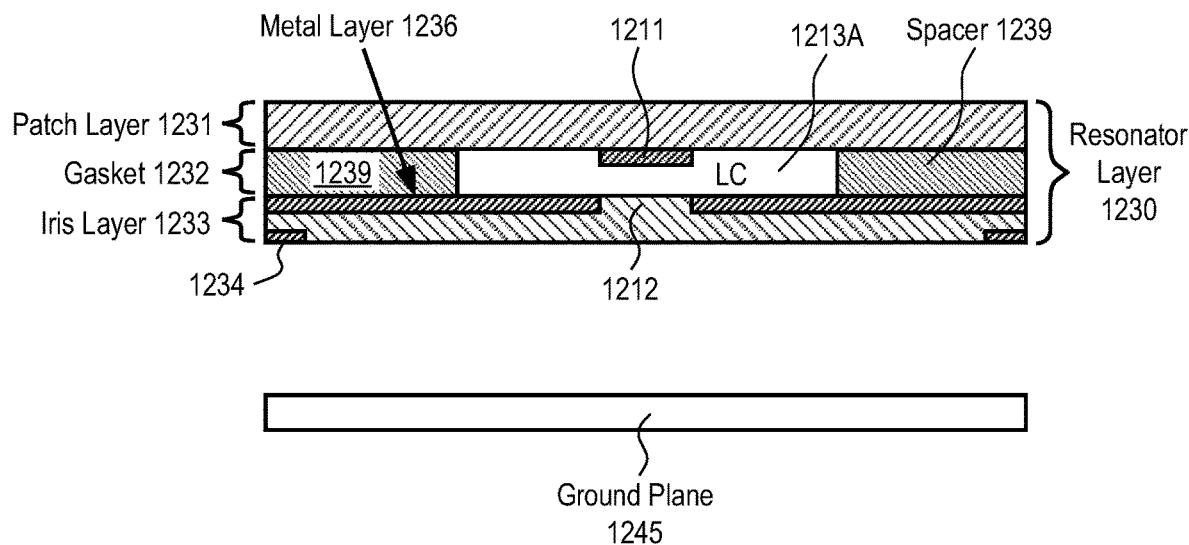
FIG. 13 illustrates a cross section view of one embodiment of a physical antenna aperture.

FIG. 13 illustrates a cross section view of one embodiment of a physical antenna aperture. The antenna aperture includes ground plane 1245, and a metal layer 1236 within iris layer 1233, which is included in reconfigurable resonator layer 1230. In one embodiment, the antenna aperture of FIG. 13 includes a plurality of tunable resonator/slots 1210 of FIG. 12. Iris/slot 1212 is defined by openings in metal layer 1236. A feed wave, such as feed wave 1205 of FIG. 11, may have a microwave frequency compatible with satellite communication channels. The feed wave propagates between ground plane 1245 and resonator layer 1230.

Reconfigurable resonator layer 1230 also includes gasket layer 1232 and patch layer 1231. Gasket layer 1232 is disposed between patch layer 1231 and iris layer 1233. Note that in one embodiment, a spacer could replace gasket layer 1232. In one embodiment, iris layer 1233 is a printed circuit board ("PCB") that includes a copper layer as metal layer 1236. In one embodiment, iris layer 1233 is glass. Iris layer 1233 may be other types of substrates.

Openings may be etched in the copper layer to form iris/slots 1212. In one embodiment, iris layer 1233 is conductively coupled by a conductive bonding layer to another structure (e.g., a waveguide) in FIG. 13. Note that in an embodiment the iris layer is not conductively coupled by a conductive bonding layer and is instead interfaced with a non-conducting bonding layer.

Patch layer 1231 may also be a PCB that includes metal as radiating patches 1211. In one embodiment, gasket layer 1232 includes spacers 1239 that provide a mechanical standoff to define the dimension between metal layer 1236 and patch 1211. In one embodiment, the spacers are 75 microns, but other sizes may be used (e.g., 3-200 mm). As mentioned above, in one embodiment, the antenna aperture of FIG. 13 includes multiple tunable resonator/slots, such as tunable resonator/slot 1210 includes patch 1211, liquid crystal 1213, and iris/slot 1212 of FIG. 12. The chamber for liquid crystal 1213 is defined by spacers 1239, iris layer 1233 and metal layer 1236. When the chamber is filled with liquid crystal, patch layer 1231 can be laminated onto spacers 1239 to seal liquid crystal within resonator layer 1230.

A voltage between patch layer 1231 and iris layer 1233 can be modulated to tune the liquid crystal in the gap between the patch and the slots (e.g., tunable resonator/slot 1210). Adjusting the voltage across liquid crystal 1213 varies the capacitance of a slot (e.g., tunable resonator/slot 1210). Accordingly, the reactance of a slot (e.g., tunable resonator/slot 1210) can be varied by changing the capacitance. Resonant frequency of tunable resonator/slot 1210 also changes according to the equation $$f = \frac{1}{2\pi\sqrt{LC}}$$

where f is the resonant frequency of tunable resonator/slot 1210 and L and C are the inductance and capacitance of tunable resonator/slot 1210, respectively. The resonant frequency of tunable resonator/slot 1210 affects the energy radiated from feed wave 1205 propagating through the waveguide. As an example, if feed wave 1205 is 20 GHz, the resonant frequency of a tunable resonator/slot 1210 may be adjusted (by varying the capacitance) to 17 GHz so that the tunable resonator/slot 1210 couples substantially no energy from feed wave 1205. Or, the resonant frequency of a tunable resonator/slot 1210 may be adjusted to 20 GHz so that the tunable resonator/slot 1210 couples energy from feed wave 1205 and radiates that energy into free space. Although the examples given are binary (fully radiating or not radiating at all), full gray scale control of the reactance, and therefore the resonant frequency of tunable resonator/slot 1210 is possible with voltage variance over a multi-valued range. Hence, the energy radiated from each tunable resonator/slot 1210 can be finely controlled so that detailed holographic diffraction patterns can be formed by the array of tunable slots (e.g., tunable resonator/slots).

In one embodiment, tunable slots in a row are spaced from each other by λ/5. Other spacings may be used. In one embodiment, each tunable slot in a row is spaced from the closest tunable slot in an adjacent row by λ/2, and, thus, commonly oriented tunable slots in different rows are spaced by λ/4, though other spacings are possible (e.g., λ/5, λ/6 .3). In another embodiment, each tunable slot in a row is spaced from the closest tunable slot in an adjacent row by λ/3.

Embodiments use reconfigurable metamaterial technology, such as described in U.S. patent application Ser. No. 14/550,178, entitled "Dynamic Polarization and Coupling Control from a Steerable Cylindrically Fed Holographic Antenna", filed Nov. 21, 2014 and U.S. patent application Ser. No. 14/610,502, entitled "Ridged Waveguide Feed Structures for Reconfigurable Antenna", filed Jan. 30, 2015.

FIGS. 14A-D illustrate one embodiment of the different layers for creating the slotted array. The antenna array includes antenna elements that are positioned in rings, such as the example rings shown in FIG. 10. Note that in this example the antenna array has two different types of antenna elements that are used for two different types of frequency bands.

Figure 14A:
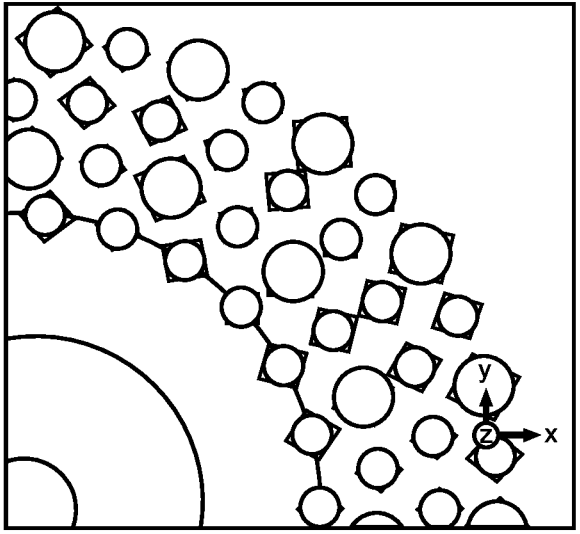
FIGS. 14A-D illustrate one embodiment of the different layers for creating the slotted array.
Figure 14B:
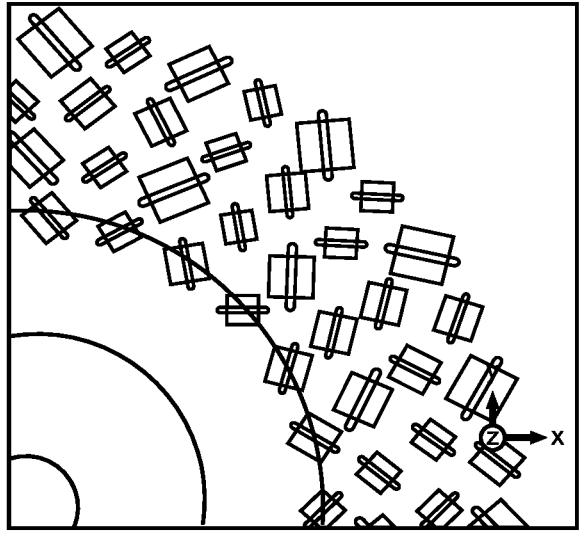
Figure 14C:
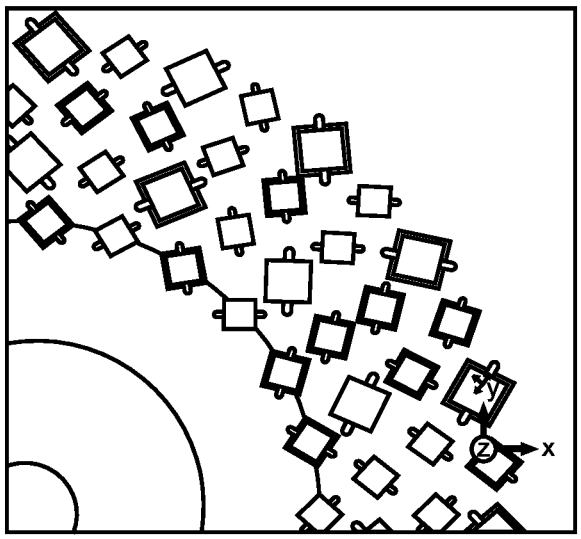
Figure 14D:
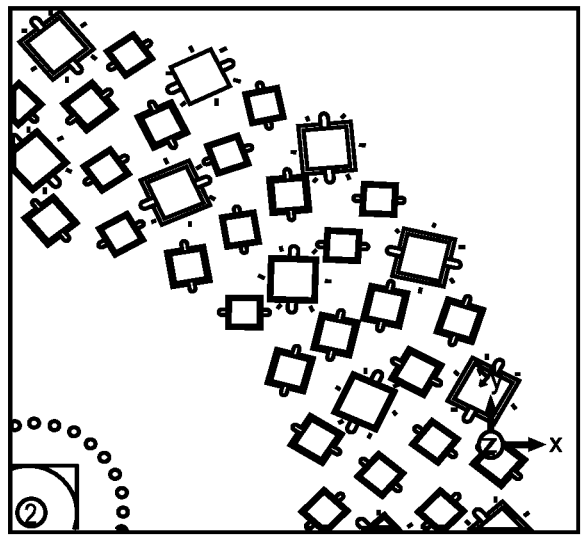

FIG. 14A illustrates a portion of the first iris board layer with locations corresponding to the slots. Referring to FIG. 14A, the circles are open areas/slots in the metallization in the bottom side of the iris substrate, and are for controlling the coupling of elements to the feed (the feed wave). Note that this layer is an optional layer and is not used in all designs. FIG. 14B illustrates a portion of the second iris board layer containing slots. FIG. 14C illustrates patches over a portion of the second iris board layer. FIG. 14D illustrates a top view of a portion of the slotted array.

Figure 15:
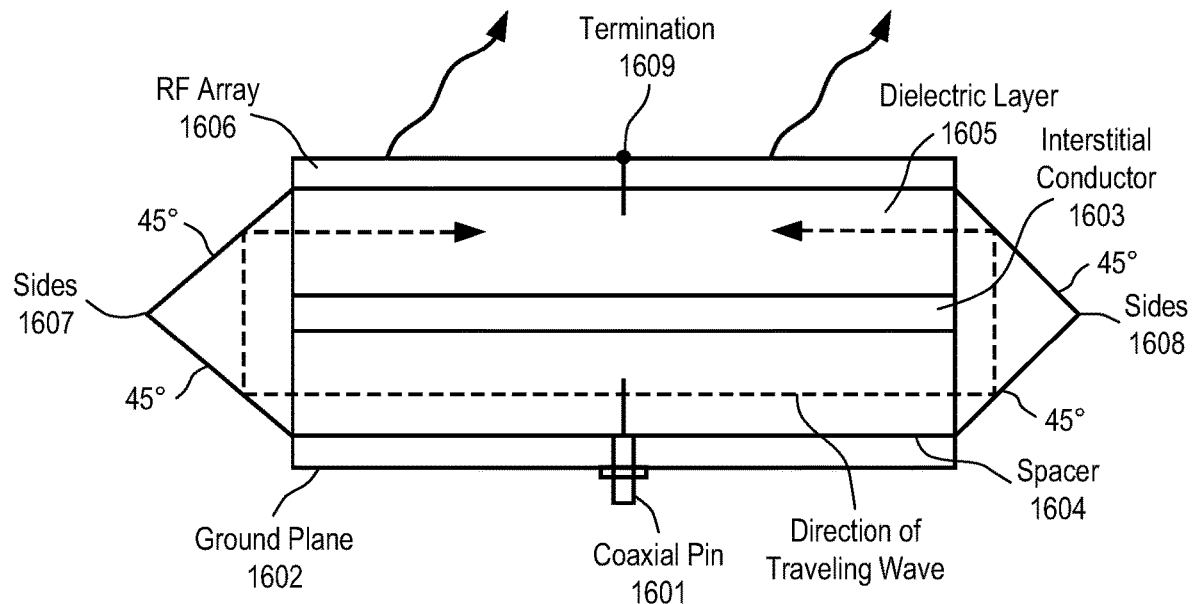
FIG. 15 illustrates a side view of one embodiment of a cylindrically fed antenna structure.

FIG. 15 illustrates a side view of one embodiment of a cylindrically fed antenna structure. The antenna produces an inwardly travelling wave using a double layer feed structure (i.e., two layers of a feed structure). In one embodiment, the antenna includes a circular outer shape, though this is not required. That is, non-circular inward travelling structures can be used. In one embodiment, the antenna structure in FIG. 15 includes the coaxial feed described with reference to FIG. 10.

Referring to FIG. 15, a coaxial pin 1601 is used to excite the field on the lower level of the antenna. In one embodiment, coaxial pin 1601 is a 50Ω coax pin that is readily available. Coaxial pin 1601 is coupled (e.g., bolted) to the bottom of the antenna structure, which is conducting ground plane 1602.

Separate from conducting ground plane 1602 is interstitial conductor 1603, which is an internal conductor. In one embodiment, conducting ground plane 1602 and interstitial conductor 1603 are parallel to each other. In one embodiment, the distance between ground plane 1602 and interstitial conductor 1603 is 0.1-0.15". In another embodiment, this distance may be $\lambda/2$, where $\lambda$ is the wavelength of the travelling wave at the frequency of operation.

Ground plane 1602 is separated from interstitial conductor 1603 via a spacer 1604. In one embodiment, spacer 1604 is a foam or air-like spacer. In one embodiment, spacer 1604 comprises a plastic spacer.

On top of interstitial conductor 1603 is dielectric layer 1605. In one embodiment, dielectric layer 1605 is plastic. The purpose of dielectric layer 1605 is to slow the travelling wave relative to free space velocity. In one embodiment, dielectric layer 1605 slows the travelling wave by 30% relative to free space. In one embodiment, the range of indices of refraction that are suitable for beam forming are 1.2-1.8, where free space has by definition an index of refraction equal to 1. Other dielectric spacer materials, such as, for example, plastic, may be used to achieve this effect. Note that materials other than plastic may be used as long as they achieve the desired wave slowing effect. Alternatively, a material with distributed structures may be used as dielectric layer 1605, such as periodic sub-wavelength metallic structures that can be machined or lithographically defined, for example.

An RF-array 1606 is on top of dielectric layer 1605. In one embodiment, the distance between interstitial conductor 1603 and RF-array 1606 is 0.1-0.15". In another embodiment, this distance may be $\lambda_{\it eff}/2$, where $\lambda_{\it eff}$ is the effective wavelength in the medium at the design frequency.

The antenna includes sides 1607 and 1608. Sides 1607 and 1608 are angled to cause a travelling wave feed from coax pin 1601 to be propagated from the area below interstitial conductor 1603 (the spacer layer) to the area above interstitial conductor 1603 (the dielectric layer) via reflection. In one embodiment, the angle of sides 1607 and 1608 are at 45° angles. In an alternative embodiment, sides 1607 and 1608 could be replaced with a continuous radius to achieve the reflection. While FIG. 15 shows angled sides that have angle of 45 degrees, other angles that accomplish signal transmission from lower level feed to upper level feed may be used. That is, given that the effective wavelength in the lower feed will generally be different than in the upper feed, some deviation from the ideal 45° angles could be used to aid transmission from the lower to the upper feed level. For example, in another embodiment, the 45° angles are replaced with a single step. The steps on one end of the antenna go around the dielectric layer, interstitial the conductor, and the spacer layer. The same two steps are at the other ends of these layers.

In operation, when a feed wave is fed in from coaxial pin 1601, the wave travels outward concentrically oriented from coaxial pin 1601 in the area between ground plane 1602 and interstitial conductor 1603. The concentrically outgoing waves are reflected by sides 1607 and 1608 and travel inwardly in the area between interstitial conductor 1603 and RF array 1606. The reflection from the edge of the circular perimeter causes the wave to remain in phase (i.e., it is an in-phase reflection). The travelling wave is slowed by dielectric layer 1605. At this point, the travelling wave starts interacting and exciting with elements in RF array 1606 to obtain the desired scattering.

To terminate the travelling wave, a termination 1609 is included in the antenna at the geometric center of the antenna. In one embodiment, termination 1609 comprises a pin termination (e.g., a 50Ω pin). In another embodiment, termination 1609 comprises an RF absorber that terminates unused energy to prevent reflections of that unused energy back through the feed structure of the antenna. These could be used at the top of RF array 1606.

Figure 16:
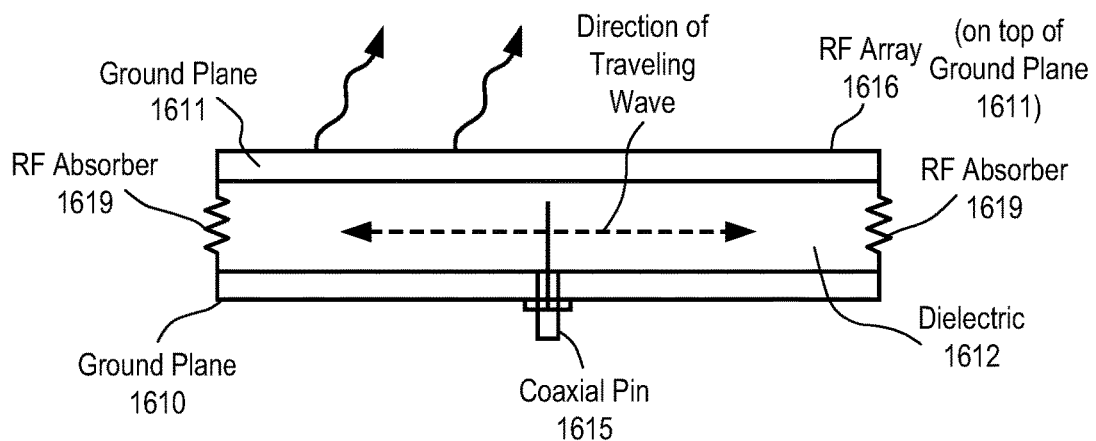
FIG. 16 illustrates another embodiment of the antenna system with an outgoing wave.

FIG. 16 illustrates another embodiment of the antenna system with an outgoing wave. Referring to FIG. 16, two ground planes 1610 and 1611 are substantially parallel to each other with a dielectric layer 1612 (e.g., a plastic layer, etc.) in between ground planes. RF absorbers 1619 (e.g., resistors) couple the two ground planes 1610 and 1611 together. A coaxial pin 1615 (e.g., 50Ω) feeds the antenna. An RF array 1616 is on top of dielectric layer 1612 and ground plane 1611.

In operation, a feed wave is fed through coaxial pin 1615 and travels concentrically outward and interacts with the elements of RF array 1616.

The cylindrical feed in both the antennas of FIGS. 15 and 16 improves the service angle of the antenna. Instead of a service angle of plus or minus forty-five degrees azimuth (±45° Az) and plus or minus twenty five degrees elevation (±25° El), in one embodiment, the antenna system has a service angle of seventy five degrees (75°) from the bore sight in all directions. As with any beam forming antenna comprised of many individual radiators, the overall antenna gain is dependent on the gain of the constituent elements, which themselves are angle-dependent. When using common radiating elements, the overall antenna gain typically decreases as the beam is pointed further off bore sight. At 75 degrees off bore sight, significant gain degradation of about 6 dB is expected.

Embodiments of the antenna having a cylindrical feed solve one or more problems. These include dramatically simplifying the feed structure compared to antennas fed with a corporate divider network and therefore reducing total required antenna and antenna feed volume; decreasing sensitivity to manufacturing and control errors by maintaining high beam performance with coarser controls (extending all the way to simple binary control); giving a more advantageous side lobe pattern compared to rectilinear feeds because the cylindrically oriented feed waves result in spatially diverse side lobes in the far field; and allowing polarization to be dynamic, including allowing left-hand circular, right-hand circular, and linear polarizations, while not requiring a polarizer.

Array of Wave Scattering Elements

RF array 1606 of FIG. 15 and RF array 1616 of FIG. 16 include a wave scattering subsystem that includes a group of patch antennas (i.e., scatterers) that act as radiators. This group of patch antennas comprises an array of scattering metamaterial elements.

In one embodiment, each scattering element in the antenna system is part of a unit cell that consists of a lower conductor, a dielectric substrate and an upper conductor that embeds a complementary electric inductive-capacitive resonator ("complementary electric LC" or "CELC") that is etched in or deposited onto the upper conductor.

In one embodiment, a liquid crystal (LC) is injected in the gap around the scattering element. Liquid crystal is encapsulated in each unit cell and separates the lower conductor associated with a slot from an upper conductor associated with its patch. Liquid crystal has a permittivity that is a function of the orientation of the molecules comprising the liquid crystal, and the orientation of the molecules (and thus the permittivity) can be controlled by adjusting the bias voltage across the liquid crystal. Using this property, the liquid crystal acts as an on/off switch for the transmission of energy from the guided wave to the CELC. When switched on, the CELC emits an electromagnetic wave like an electrically small dipole antenna.

Controlling the thickness of the LC increases the beam switching speed. A fifty percent (50%) reduction in the gap between the lower and the upper conductor (the thickness of the liquid crystal) results in a fourfold increase in speed. In another embodiment, the thickness of the liquid crystal results in a beam switching speed of approximately fourteen milliseconds (14 ms). In one embodiment, the LC is doped in a manner well-known in the art to improve responsiveness so that a seven millisecond (7 ms) requirement can be met.

The CELC element is responsive to a magnetic field that is applied parallel to the plane of the CELC element and perpendicular to the CELC gap complement. When a voltage is applied to the liquid crystal in the metamaterial scattering unit cell, the magnetic field component of the guided wave induces a magnetic excitation of the CELC, which, in turn, produces an electromagnetic wave in the same frequency as the guided wave.

The phase of the electromagnetic wave generated by a single CELC can be selected by the position of the CELC on the vector of the guided wave. Each cell generates a wave in phase with the guided wave parallel to the CELC. Because the CELCs are smaller than the wave length, the output wave has the same phase as the phase of the guided wave as it passes beneath the CELC.

In one embodiment, the cylindrical feed geometry of this antenna system allows the CELC elements to be positioned at forty-five degree (45°) angles to the vector of the wave in the wave feed. This position of the elements enables control of the polarization of the free space wave generated from or received by the elements. In one embodiment, the CELCs are arranged with an inter-element spacing that is less than a free-space wavelength of the operating frequency of the antenna. For example, if there are four scattering elements per wavelength, the elements in the 30 GHz transmit antenna will be approximately 2.5 mm (i.e., ¼th the 10 mm free-space wavelength of 30 GHz).

In one embodiment, the CELCs are implemented with patch antennas that include a patch co-located over a slot with liquid crystal between the two. In this respect, the metamaterial antenna acts like a slotted (scattering) wave guide. With a slotted wave guide, the phase of the output wave depends on the location of the slot in relation to the guided wave.

Cell Placement

Figure 17:
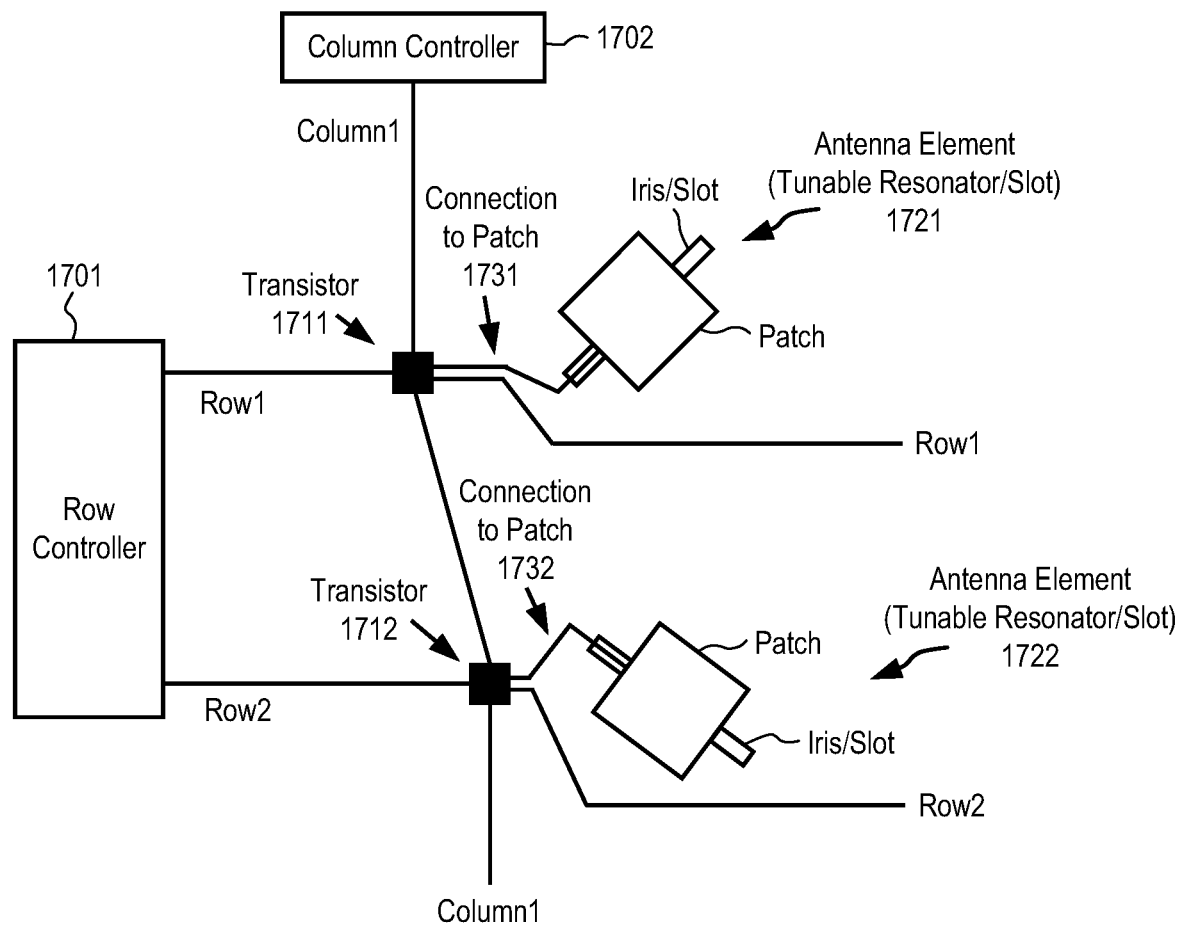
FIG. 17 illustrates one embodiment of the placement of matrix drive circuitry with respect to antenna elements.

In one embodiment, the antenna elements are placed on the cylindrical feed antenna aperture in a way that allows for a systematic matrix drive circuit. The placement of the cells includes placement of the transistors for the matrix drive. FIG. 17 illustrates one embodiment of the placement of matrix drive circuitry with respect to antenna elements. Referring to FIG. 17, row controller 1701 is coupled to transistors 1711 and 1712, via row select signals Row1 and Row2, respectively, and column controller 1702 is coupled to transistors 1711 and 1712 via column select signal Column1. Transistor 1711 is also coupled to antenna element 1721 via connection to patch 1731, while transistor 1712 is coupled to antenna element 1722 via connection to patch 1732.

In an initial approach to realize matrix drive circuitry on the cylindrical feed antenna with unit cells placed in a non-regular grid, two steps are performed. In the first step, the cells are placed on concentric rings and each of the cells is connected to a transistor that is placed beside the cell and acts as a switch to drive each cell separately. In the second step, the matrix drive circuitry is built in order to connect every transistor with a unique address as the matrix drive approach requires. Because the matrix drive circuit is built by row and column traces (similar to LCDs) but the cells are placed on rings, there is no systematic way to assign a unique address to each transistor. This mapping problem results in very complex circuitry to cover all the transistors and leads to a significant increase in the number of physical traces to accomplish the routing. Because of the high density of cells, those traces disturb the RF performance of the antenna due to coupling effect. Also, due to the complexity of traces and high packing density, the routing of the traces cannot be accomplished by commercially available layout tools.

In one embodiment, the matrix drive circuitry is predefined before the cells and transistors are placed. This ensures a minimum number of traces that are necessary to drive all the cells, each with a unique address. This strategy reduces the complexity of the drive circuitry and simplifies the routing, which subsequently improves the RF performance of the antenna.

More specifically, in one approach, in the first step, the cells are placed on a regular rectangular grid composed of rows and columns that describe the unique address of each cell. In the second step, the cells are grouped and transformed to concentric circles while maintaining their address and connection to the rows and columns as defined in the first step. A goal of this transformation is not only to put the cells on rings but also to keep the distance between cells and the distance between rings constant over the entire aperture. In order to accomplish this goal, there are several ways to group the cells.

Figure 18:
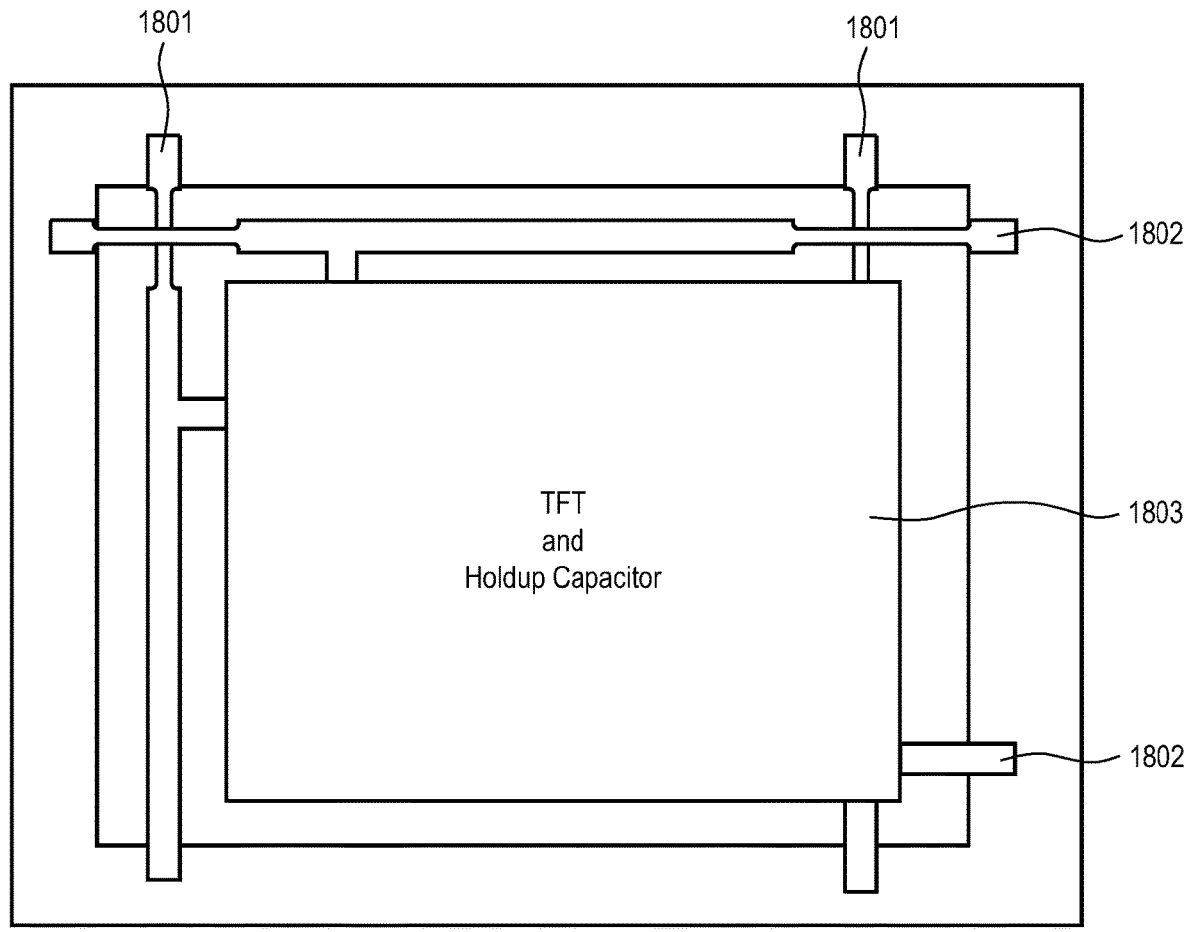
FIG. 18 illustrates one embodiment of a TFT package.

In one embodiment, a TFT package is used to enable placement and unique addressing in the matrix drive. FIG. 18 illustrates one embodiment of a TFT package. Referring to FIG. 18, a TFT and a hold capacitor 1803 is shown with input and output ports. There are two input ports connected to traces 1801 and two output ports connected to traces 1802 to connect the TFTs together using the rows and columns. In one embodiment, the row and column traces cross in 90° angles to reduce, and potentially minimize, the coupling between the row and column traces. In one embodiment, the row and column traces are on different layers.

An Example System Embodiment

In one embodiment, the combined antenna apertures are used in a television system that operates in conjunction with a set top box. For example, in the case of a dual reception antenna, satellite signals received by the antenna are provided to a set top box (e.g., a DirecTV receiver) of a television system. More specifically, the combined antenna operation is able to simultaneously receive RF signals at two different frequencies and/or polarizations. That is, one sub-array of elements is controlled to receive RF signals at one frequency and/or polarization, while another sub-array is controlled to receive signals at another, different frequency and/or polarization. These differences in frequency or polarization represent different channels being received by the television system. Similarly, the two antenna arrays can be controlled for two different beam positions to receive channels from two different locations (e.g., two different satellites) to simultaneously receive multiple channels.

Figure 19:
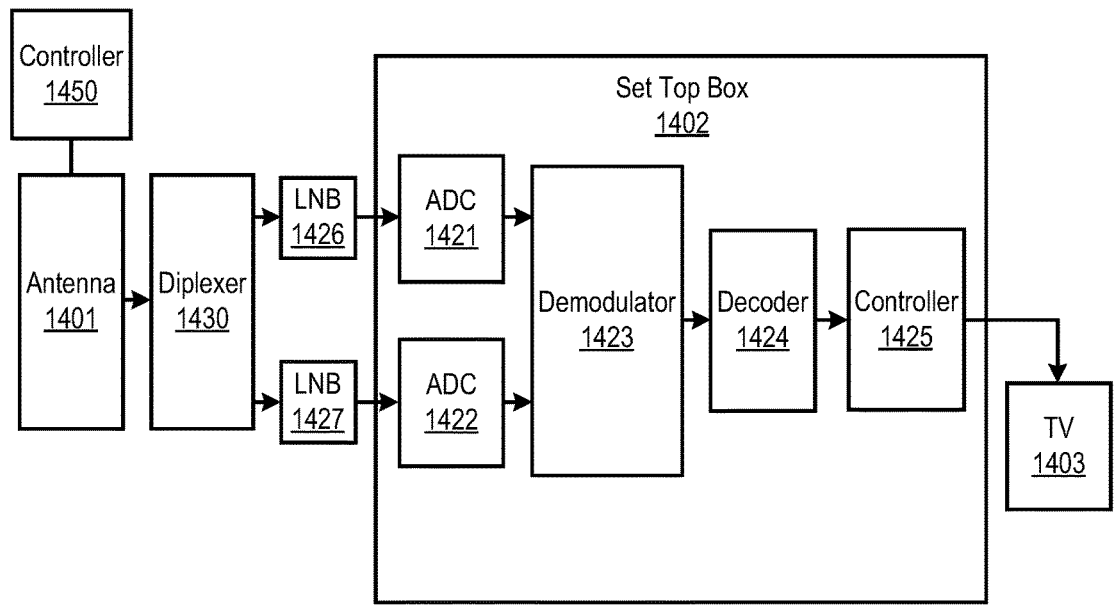
FIG. 19 is a block diagram of an embodiment of a communication system having simultaneous transmit and receive paths.

FIG. 19 is a block diagram of one embodiment of a communication system that performs dual reception simultaneously in a television system. Referring to FIG. 19, antenna 1401 includes two spatially interleaved antenna apertures operable independently to perform dual reception simultaneously at different frequencies and/or polarizations as described above. Note that while only two spatially interleaved antenna operations are mentioned, the TV system may have more than two antenna apertures (e.g., 3, 4, 5, etc. antenna apertures).

In one embodiment, antenna 1401, including its two interleaved slotted arrays, is coupled to diplexer 1430. The coupling may include one or more feeding networks that receive the signals from elements of the two slotted arrays to produce two signals that are fed into diplexer 1430. In one embodiment, diplexer 1430 is a commercially available diplexer (e.g., model PB1081WA Ku-band sitcom diplexer from A1 Microwave).

Diplexer 1430 is coupled to a pair of low noise block down converters (LNBs) 1426 and 1427, which perform a noise filtering function, a down conversion function, and amplification in a manner well-known in the art. In one embodiment, LNBs 1426 and 1427 are in an out-door unit (ODU). In another embodiment, LNBs 1426 and 1427 are integrated into the antenna apparatus. LNBs 1426 and 1427 are coupled to a set top box 1402, which is coupled to television 1403.

Set top box 1402 includes a pair of analog-to-digital converters (ADCs) 1421 and 1422, which are coupled to LNBs 1426 and 1427, to convert the two signals output from diplexer 1430 into digital format.

Once converted to digital format, the signals are demodulated by demodulator 1423 and decoded by decoder 1424 to obtain the encoded data on the received waves. The decoded data is then sent to controller 1425, which sends it to television 1403.

Controller 1450 controls antenna 1401, including the interleaved slotted array elements of both antenna apertures on the single combined physical aperture.

An Example of a Full Duplex Communication System

Figure 20:
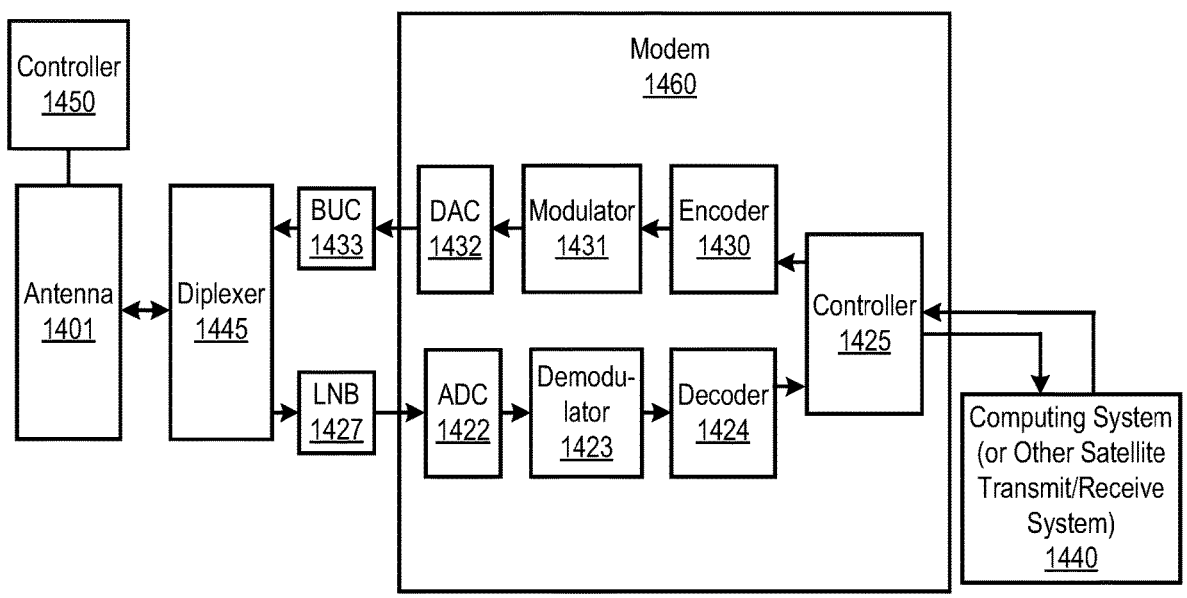
FIG. 20 is a block diagram of another embodiment of a communication system having simultaneous transmit and receive paths.

In another embodiment, the combined antenna apertures are used in a full duplex communication system. FIG. 20 is a block diagram of another embodiment of a communication system having simultaneous transmit and receive paths. While only one transmit path and one receive path are shown, the communication system may include more than one transmit path and/or more than one receive path.

Referring to FIG. 20, antenna 1401 includes two spatially interleaved antenna arrays operable independently to transmit and receive simultaneously at different frequencies as described above. In one embodiment, antenna 1401 is coupled to diplexer 1445. The coupling may be by one or more feeding networks. In one embodiment, in the case of a radial feed antenna, diplexer 1445 combines the two signals and the connection between antenna 1401 and diplexer 1445 is a single broad-band feeding network that can carry both frequencies.

Diplexer 1445 is coupled to a low noise block down converter (LNBs) 1427, which performs a noise filtering function and a down conversion and amplification function in a manner well-known in the art. In one embodiment, LNB 1427 is in an out-door unit (ODU). In another embodiment, LNB 1427 is integrated into the antenna apparatus. LNB 1427 is coupled to a modem 1460, which is coupled to computing system 1440 (e.g., a computer system, modem, etc.).

Modem 1460 includes an analog-to-digital converter (ADC) 1422, which is coupled to LNB 1427, to convert the received signal output from diplexer 1445 into digital format. Once converted to digital format, the signal is demodulated by demodulator 1423 and decoded by decoder 1424 to obtain the encoded data on the received wave. The decoded data is then sent to controller 1425, which sends it to computing system 1440.

Modem 1460 also includes an encoder 1430 that encodes data to be transmitted from computing system 1440. The encoded data is modulated by modulator 1431 and then converted to analog by digital-to-analog converter (DAC) 1432. The analog signal is then filtered by a BUC (up-convert and high pass amplifier) 1433 and provided to one port of diplexer 1445. In one embodiment, BUC 1433 is in an out-door unit (ODU).

Diplexer 1445 operating in a manner well-known in the art provides the transmit signal to antenna 1401 for transmission.

Controller 1450 controls antenna 1401, including the two arrays of antenna elements on the single combined physical aperture.

Note that the full duplex communication system shown in FIG. 20 has a number of applications, including but not limited to, internet communication, vehicle communication (including software updating), etc.

Ground Plane/Iris Heater

The techniques described herein include a number of innovations for various antennas that have RF radiating antenna elements and a material for tuning permittivity or capacitance that benefits from heating. Various embodiments of these antennas are a ground plane substrate with a heater. In one embodiment, the ground plane substrate comprises an iris substrate made of glass, printed circuit board, polyimide, polyester, flouropolymer, or fused silica for example, and has an iris heater. In some embodiments, the ground plane substrate of the antenna is an iris substrate, an iris glass or an iris glass substrate. In an alternative embodiment, the antenna comprises a liquid crystal-based antenna phase shifter that has LC material between a solid ground plane and a strip line. One embodiment of the antenna is a metamaterial antenna. In an alternative embodiment, the antenna comprises a metasurface that microfluidics and liquid metal materials instead of LC material.

For example, embodiments of the iris heater include a resistive heater on a ground plane substrate, which in some embodiments is the iris glass substrate. In alternative embodiments, the heater is also built on the patch glass substrate since it's also in direct contact with the LC layer. In one embodiment, the heater will perform a more uniform heating on the iris glass substrate due to presence of a large metal (e.g., iris metal), a thermally conductive layer, on the iris glass substrate. This layer will spread the heat and achieve a more uniform heating. In one embodiment, the iris heater is built by using an additional metal layer on the iris substrate. This additional metal layer can be placed above or below the iris metal layer as described in FIG. 22 and FIG. 23. In one embodiment, metal layers used in thin film transistor (TFT) array fabrication are used for this heater metal layer. That is, the same fabrication techniques and materials used for the metal layers of the TFT are also used for the heater metal layers. In one embodiment, the iris metal layer, also described as the slot forming layer, is patterned to provide the bus structure for the heater structure (see FIGS. 24 and 25).

Figure 22:
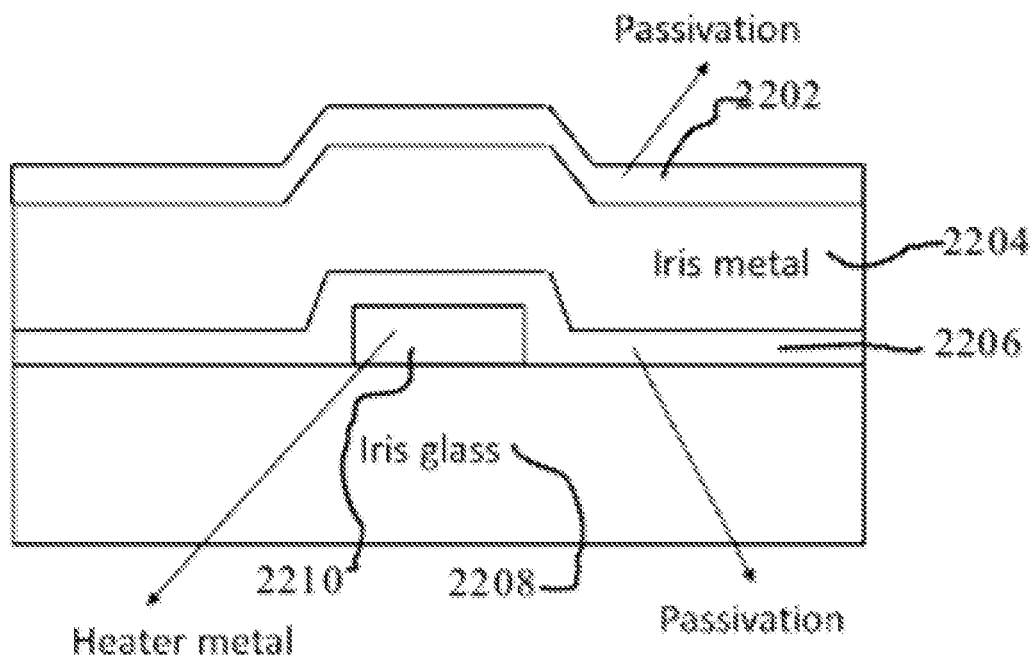
FIG. 22 is a cross-sectional view of an iris heater design where the heater layer is below an iris metal layer.

FIG. 22 is a cross-sectional view of an iris heater design where the heater layer 2210 is below the iris metal layer 2204. In the embodiment shown, the heater layer 2210 is in physical contact with the iris glass layer 2208, and in thermal contact with the iris metal layer 2204. The iris metal layer 2204 is separated from the heater layer 2210 and the iris glass layer 2208 by a passivation layer 2206. Another passivation layer 2202 covers the iris metal layer 2204. In variations applicable to this and other embodiments, there could be a passivation layer, an adhesion layer, or both, on the iris glass layer 2208. The ground plane substrate here could be considered the iris glass layer 2208, optionally with such a passivation layer and/or adhesion layer.

Figure 23:
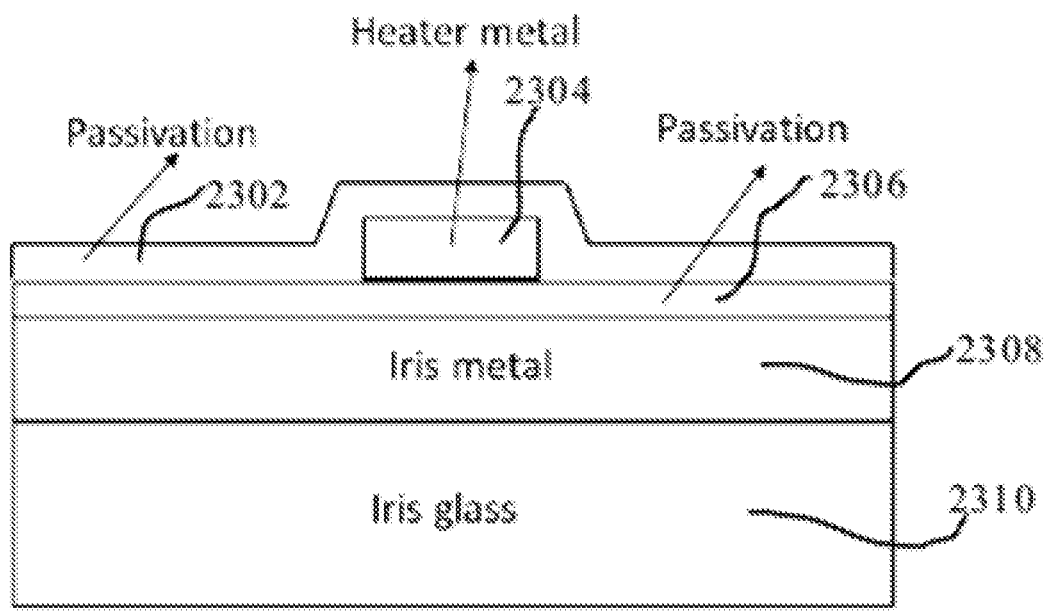
FIG. 23 is a cross-sectional view of an iris heater design where the heater layer is above an iris metal layer.

FIG. 23 is a cross-sectional view of an iris heater design where the heater metal layer 2304 is above the iris metal layer 2308. In the embodiment shown, the iris metal layer 2308 is in physical contact with the iris glass layer 2310. The heater metal layer 2304 is separated from the iris metal layer 2308 by a passivation layer 2306, and is in thermal contact with the iris metal layer 2308 through the passivation layer 2306. Another passivation layer 2302 covers the heater metal layer 2304 and also contacts the passivation layer 2306 that is on the iris metal layer 2308. The above variations for an adhesion layer and a passivation layer apply to further embodiments.

By driving a current through this new metal layer, the wire and the surrounding area including the LC layer can be heated up. This phenomenon is known as Joule heating, Ohmic heating, or resistive heating. Any amount of current will cause some heating, which is proportional to the square of the current amount. Amount of current needed for a desired temperature increase depends on the amount of temperature increase, mass of the antenna, heat capacity of the antenna, resistance of heater lines, heat dissipation of the antenna, and how fast that temperature should be reached.

A general description for a heater is described herein, along with specific embodiments. Concepts depicted below are building on that description.

Bus Bar Design on Iris Metal with RF Blocking Metal for Iris Heater

In one embodiment, the iris heater structure has three components: a bus bar supplying current, heater wires and a bus bar collecting the current. In one embodiment, the iris metal is part of the RF waveguide. In various embodiments of the antenna, an opening is created in this iris metal to define bus bars. RF will leak through those openings if there is not another metal layer covering those openings. Some embodiments use portions of the heater metal layer to cover those openings and act as RF blocking metal (e.g., see FIGS. 27 and 28). In some embodiments, bus bar thickness is the same as iris metal thickness (e.g., a few micrometers). Width of a bus bar in some embodiments is in a range of a few millimeters to tens of millimeters. Example materials for the bus bars include, but is not limited to, one or more of Cu, Ag, Au. In one embodiment, the bus bar is made using the same metal layer as the iris metal.

Voltage drop on the two bus bars should be minimized, and ideally be zero, for efficient heating operation. In other words, the resistance of the bus bars should be very low compared to the resistance of the heating element for efficient heater operation. In one embodiment, the bus bars are long metal structures going along the two (e.g., FIG. 24), three (e.g., FIG. 25) or all (e.g., FIG. 26) edges of a metamaterial antenna segment. In one embodiment, the antenna segments are those described in U.S. Pat. No. 9,887,455. There are also other combinations possible to an experienced person in the field.

In one embodiment, the bars are fabricated from materials with low resistance to have much lower resistance compared to heater wires. In one embodiment, the iris metal used as part of a waveguide in the metamaterial antenna is fabricated using multiple micrometer thick metals with high conductance (e.g., a range of $3-5\times10^7$ S/m) because of antenna requirements. Patterning part of this metal for use as heater bus bars will result in a more efficient heater design. Various embodiments of bus bars are described below.

Figure 24:
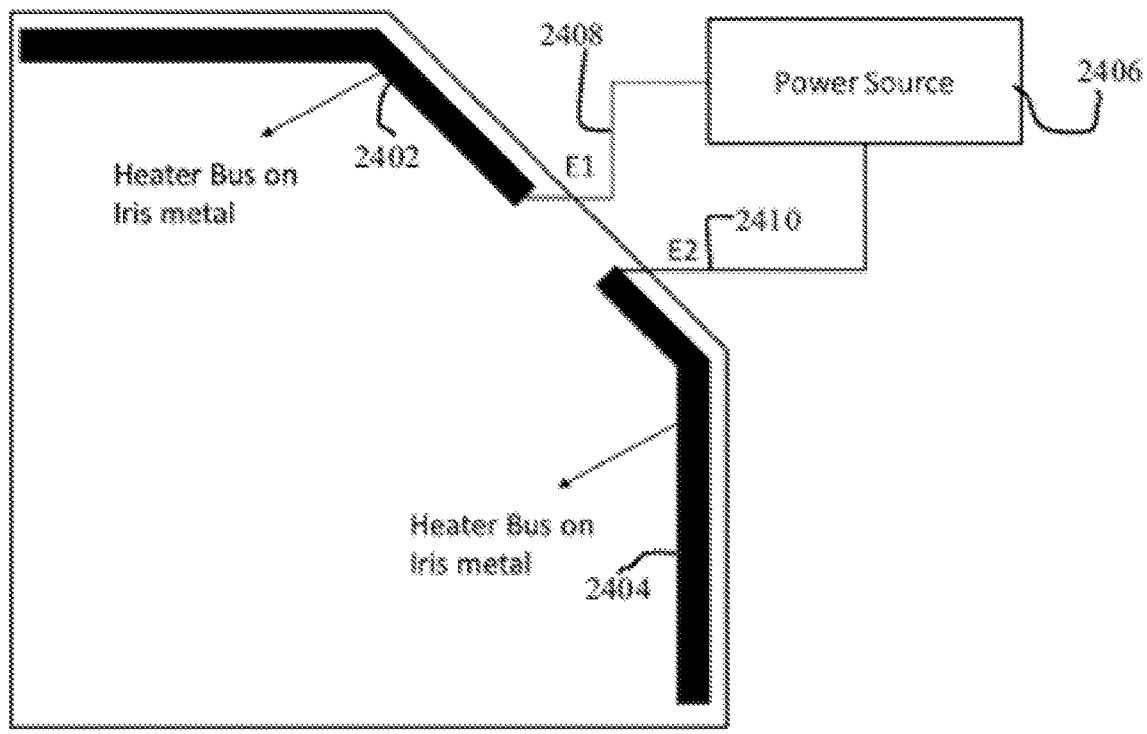
FIG. 24 illustrates bus bars along two edges of an antenna segment.

FIG. 24 illustrates bus bars 2402 and 2404 going along two edges of a metamaterial antenna segment. Power source connections with electrodes 2408 and 2410 shown here are also applicable to other heater bus designs. In the embodiment shown, a power source 2406 has one power source connection electrode 2408, labeled E1, to one bus bar 2402 of the heater bus on an iris metal layer, and another power source connection electrode 2410, labeled E2, to another bus bar 2404 of the heater bus on an iris metal layer.

Figure 25:
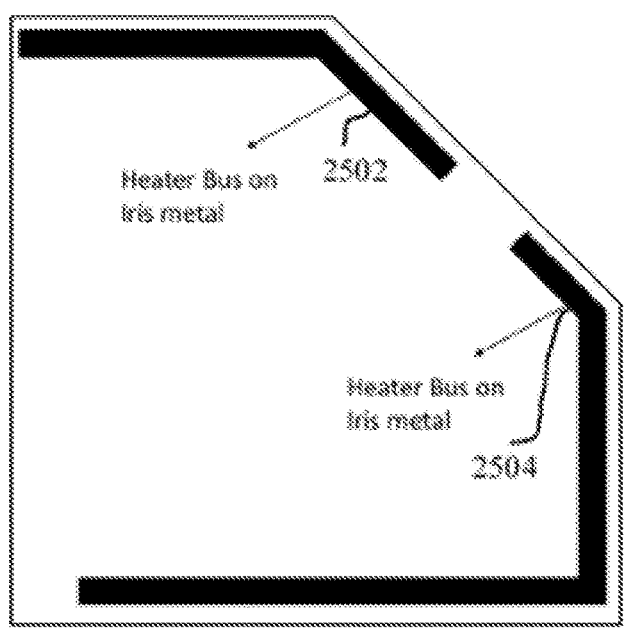
FIG. 25 illustrates bus bars along three edges of an antenna segment.

FIG. 25 illustrates bus bars 2502 going along three edges of a metamaterial antenna segment. The heater bus bar is on an iris metal layer. Power source 2406 and power source connections through electrodes 2408 and 2410 (not shown in FIG. 25, but see FIG. 24) apply in one embodiment.

Figure 26:
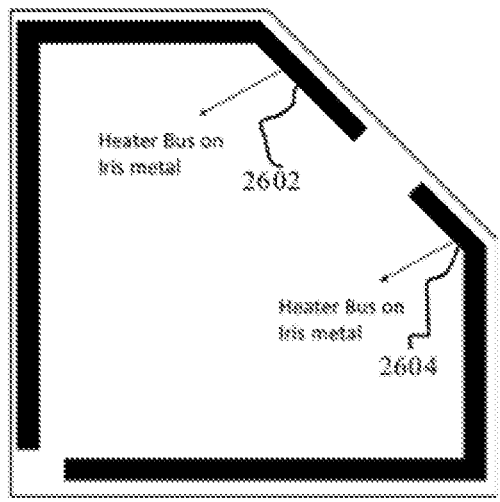
FIG. 26 illustrates bus bars along all edges of an antenna segment.

FIG. 26 illustrates bus bars 2602 and 2604 going along all edges of a metamaterial antenna segment. The heater bus bar is on the iris metal layer. Power source 2406 and power source connections through electrodes 2408 and 2410 (not shown in FIG. 26, but see FIG. 24) apply in one embodiment.

Further bus bar patterns besides those in FIGS. 24, 25 and 26 may be used. The final bus pattern chosen would be a function of the pattern of the heater wiring on the second layer and the method of connecting such wires to the bus. This heater wiring pattern would be chosen based on the chosen method of providing uniform heating to the antenna aperture. This may include varying widths, lengths, thicknesses and routing of the individual heater wires. The bus pattern design may depend on design decisions of how the uniform heating is achieved.

Figure 27:
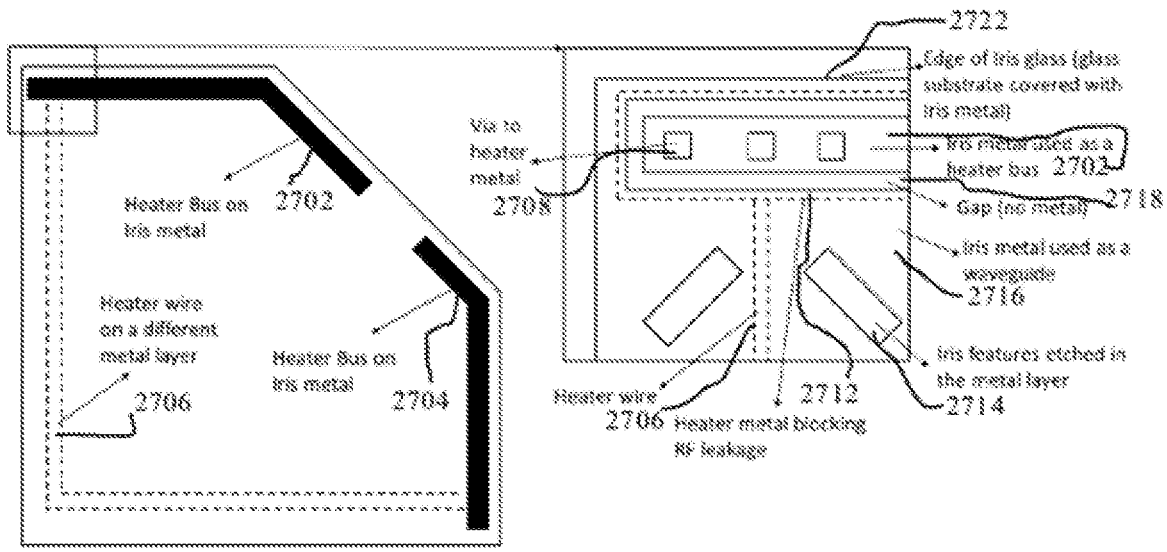
FIG. 27 illustrates a heater bus bar fabricated on an iris metal layer and a corresponding description.

FIG. 27 illustrates heater bus bars 2702 and 2704 fabricated on an iris metal layer and a corresponding close-up description. The close-up view on the right in FIG. 27 magnifies the view of the upper left of FIG. 27 and is repeated in FIG. 28, highlighting a problematic gap 2718 of no metal which could otherwise (without problem-solving) incur RF leakage in the antenna resulting from physical and electrical separation of the iris metal portions 2716, 2810 and the bus bars 2702, 2704. In this embodiment, the heater metal bar 2712 that blocks the RF leakage as part of the waveguide through the gap 2718 in the iris metal layer (iris forming layer) will be on the metal layer added to the glass substrate. This metal layer is also used for building heater traces.

Figure 28:
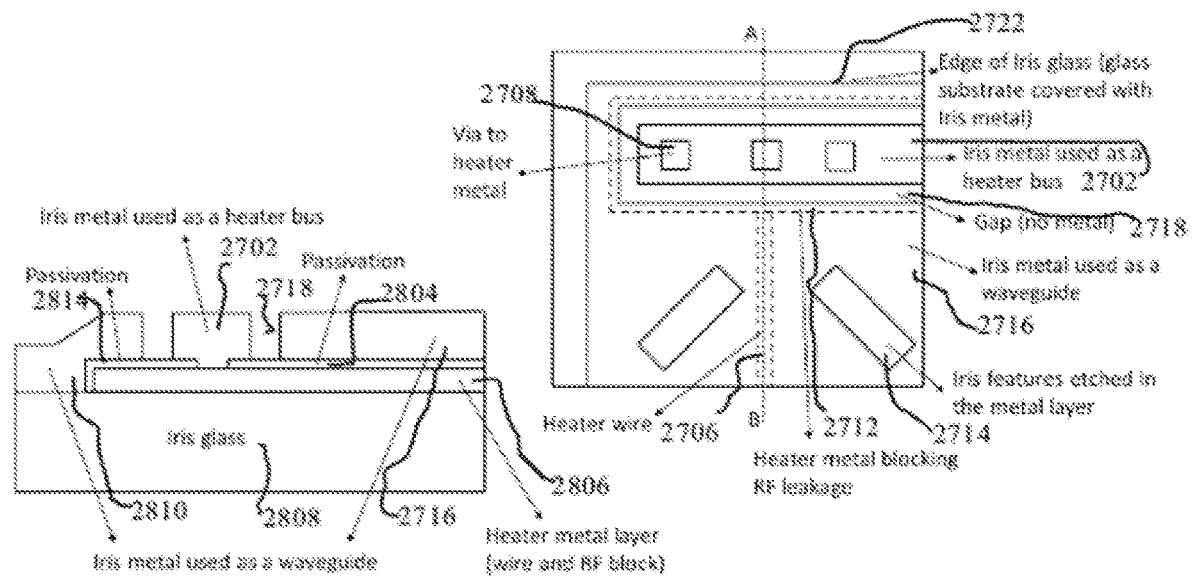
FIG. 28 is an illustration of a heater bus bar fabricated on an iris metal and a corresponding cross-sectional view.

FIG. 28 is a close-up illustration of a heater bus bar 2702 fabricated on an iris metal layer (as seen in FIG. 27) and a corresponding cross-sectional view along A-B. The iris glass layer 2808, shown in the cross-sectional view, supports the iris metal that is part of a waveguide and also supports various embodiments of a heater structure. The iris glass layer 2808 has an edge 2722 of the iris glass substrate, defined by an iris metal layer portion 2810 where the iris metal stops. In one embodiment, the iris metal stops before the edge of the glass. This avoids possible damage to the metal edge during cutting and from future environmental stress by burying the metal edge under passivation away from the edge. The glass, the glass edge and the metal edge are related by a design rule, in one embodiment.

In the close-up view (shared in common by FIGS. 27 and 28), a border of the heater metal layer 2806 is shown with dashed lines. Part of the dashed line heater metal layer border defines the heater wire 2706, and another part of the dashed line heater metal layer border defines a metal region, described below as a bar 2712 of heater metal layer, underneath via openings 2708 and underneath a gap 2718 in which there is no metal between a bus bar 2702 and iris metal layer portions 2716, 2810.

One embodiment of a heater bus bar 2702 fabricated on an iris metal layer with iris metal layer portions 2716 and 2810 is described in FIG. 27 and FIG. 28, respectively. A single heater wire 2706 is shown within the dotted lines in these figures to show how the heater wire 2706 is connected to the bus bar 2702. However, in alternative embodiments, there are multiple heater wires in the realization of the heater design. In one embodiment, the gap 2718 is created in the iris metal layer to isolate the heater bus bar 2702 from the iris metal layer used as a waveguide and part of the antenna element. In one embodiment, a via opening 2708 in the electrical isolation layer (e.g., passivation layer 2804) between the iris metal and the heater metal layer 2806 is created to connect the bus bar 2702 to the heater wire 2706 (FIG. 28). This passivation layer 2804 can be built using common dielectric layers in semiconductor manufacturing such as, for example, but not limited to, SiNx or SiO2. A bar 2712 of heater metal layer is used to connect the heater bus bar 2702 in iris metal to the heater wires 2706. In one embodiment, this bar 2712 in heater metal is extended to cover the gap 2718 area in the iris metal, between the iris metal bus bar 2702 and iris metal Vcom (common voltage) plane, and prevent RF leakage.

In a further embodiment, the positions of the iris metal and the heater metal are inverted, such that the heater metal is on top of the iris metal, and the gap between the iris metal bus and the iris metal waveguide is covered by a portion of heater metal. In embodiments where the heater is below, the iris metal in the array shields the LC from the fields generated by operating the heater.

In one embodiment, the heater operates under a constant voltage. In another embodiment, the heater is operated in a polarity inversion mode, where a differential voltage is first applied by the power source 2406 to heater electrodes 2408 E1 and 2410 E2 (FIG. 24), for example, where E1-E2 voltage difference is positive for a period of time, for example T. At the end of the period T, polarity is reversed such that E1-E2 voltage difference is negative but has the same magnitude as the previous for a period of T. The E1-E2 voltage difference toggles between negative and positive at each T to prevent any degradation in LC, image sticking, etc., due to DC voltage. One example of polarity inversion mode is part of the time V_E1=0V, V_E2=24V and in the other part V_E1=24V and V_E2=0V. One example of polarity inversion mode clocks the period T to the refresh rate of the TFT glass, in a sub 0 ms range.

In one embodiment, the heater bus bar structure is placed between the seal, connecting iris and patch substrate, and the active area consisting of antenna elements. In that case, the seal can still be used for electrical connection between iris common electrode (iris Vcom which is also the iris metal used as waveguide) and patch common electrode (patch Vcom). Alternatively, the bus bar could be formed partially under the seal in part of the seal, while other portions of the seal form the connections to Vcom.

In FIG. 27 and FIG. 28, bus bars are shown for only two edges to simplify the drawing but they can also be built like configurations similar to FIGS. 4A, 4B and 5. In FIG. 27 and FIG. 28, bus bars are described for a heating metal layer underneath the iris metal. This technique is not limited to this configuration and can also be used for a heater metal layer over the iris metal.

Radial Bus Bar Design with Uniform Heating

In one embodiment, one aspect of the heater design is to achieve uniform heating in the metamaterial antenna segment. Non-uniform heating in the segment can cause resonance frequency differences between parts of the segment and degrade the antenna performance. One approach to obtaining uniform heating is to keep the heat generation constant at a unit area all over the segment surface. In one embodiment, this is done by changing the width of heater wires as their length changes to match their resistance using the following equation where R is wire resistance, L is length of the wire, w is the width of the wire, t is the thickness of the wire and ρ is resistivity of the wire material.

$$R = \rho L / wt$$

However, accuracy of this technique is susceptible to the metal layer manufacturing tolerance. That tolerance will have more significant effects on narrow wires compared to wide ones. In an alternative embodiment, radial symmetry and periodicity in radial direction of the antenna segment are used for placement of heater wires with the same resistance and heat generation amount. In one embodiment, RF elements are placed on concentric rings in the antenna and radius of those rings are calculated with r=ring_no*r_constant. Therefore, the rings of RF elements are separated by r_constant. For example, the constant value r_constant equals 5-6 mm in one embodiment.

Figure 29:
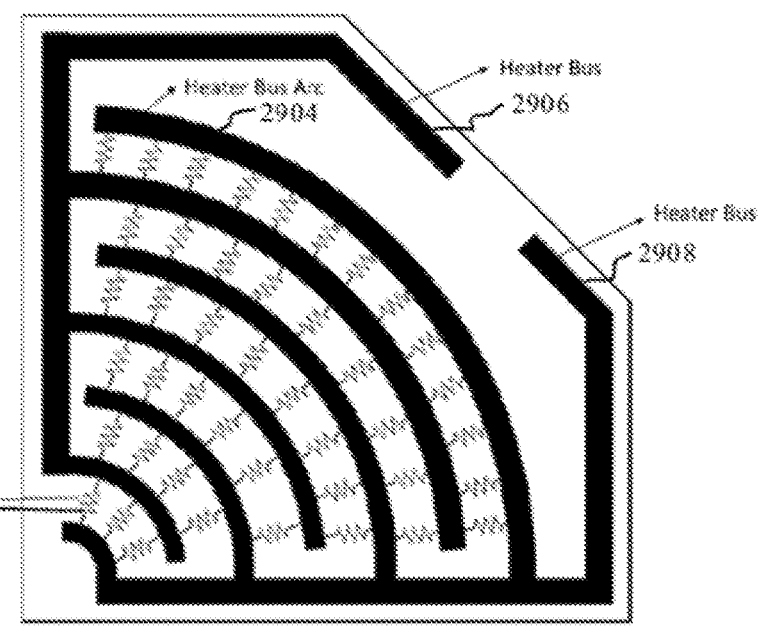
FIG. 29 illustrates a radial heater bus and placement of heater wires.

An example of this placement is described in FIG. 29. FIG. 29 illustrates a radial heater bus and placement of heater wires. Referring to FIG. 29, antenna elements 3006 (FIG. 30) in a metamaterial antenna are placed along the perimeter of concentric rings. In one embodiment, the radius of these concentric rings increases at a constant step size. In other words, there is an antenna element 3006 at every N mm when moving from the center radially. These gaps between each rings of antenna elements are used for placement of heater bus bars 2906 and 2908 in FIG. 29. The heater bus, including heater bus bars 2906 and 2908 and heater bus bar arcs 2904, can be built from a heater metal layer or an iris metal layer as described above. Radial heater bus bar arcs 2904 connect to one of the two heater bus bars 2906 and 2908 in the perimeter of the segment in an alternating fashion. Resistive heating elements 2902 are placed between these bus bar arcs 2904. Since the distance in the radial direction is the same between two bus bar arcs 2904 throughout the segment, the same resistive heating element 2902 can be used everywhere in the antenna element area. In one embodiment, the number of resistive heating elements 2902 in each ring is changed proportional to the area of the ring to keep the heating uniform. There will be some change in bus resistance based on where a heater element connects to the bus. However, heater arcs connecting to heater bus alternatingly compensate resistance differences along the length between heater buses. Additionally, heater bus arc width can be varied to have a constant heating per unit area. In one embodiment, the bus width becomes thinner from the first element on the bus (closer to the current input) to the last resistive heating element 2902 on the bus.

Iris Metal Layer as a Heater

Figure 30:
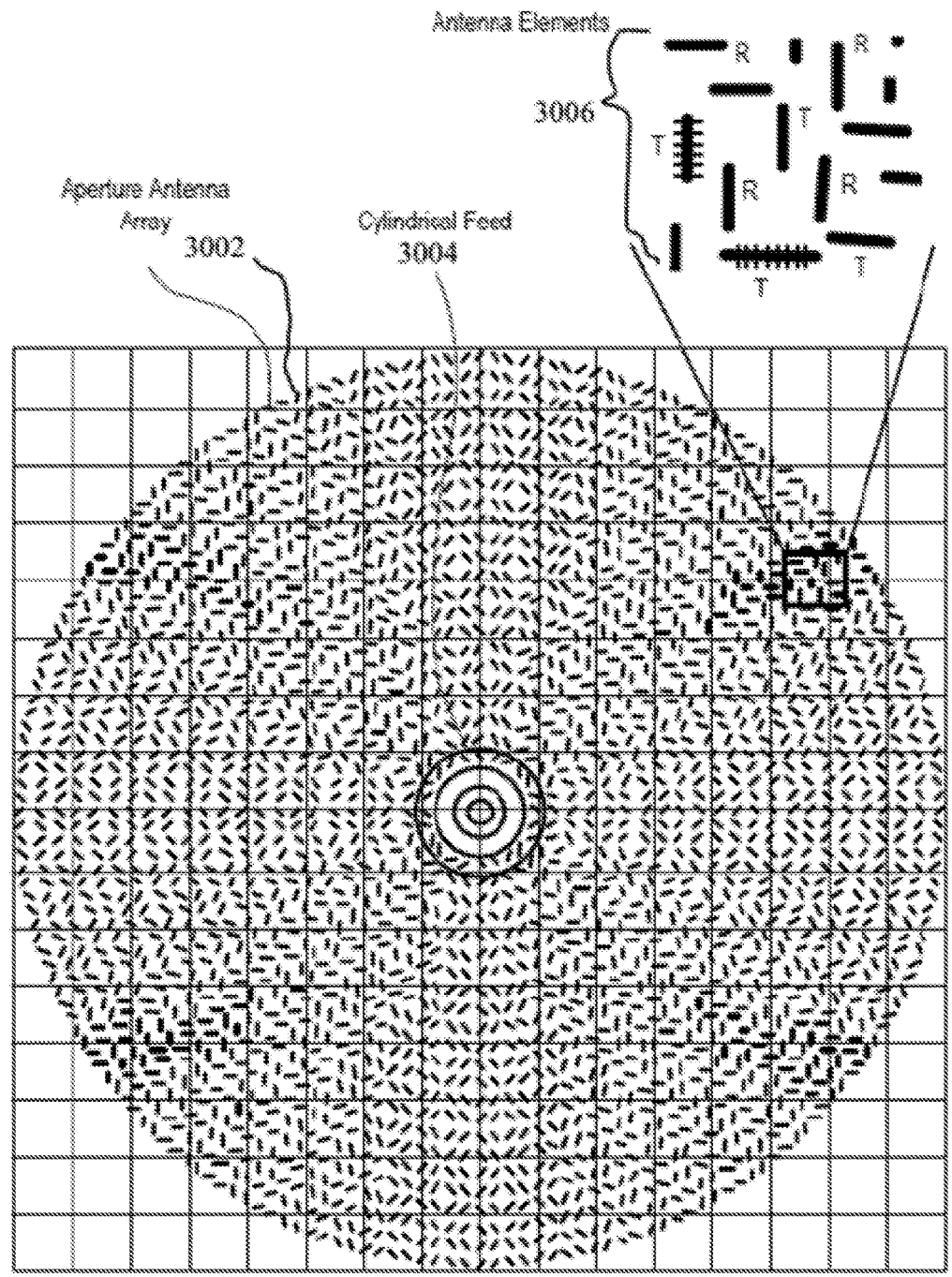
FIG. 30 illustrates the iris metal layer, in which an array of antenna elements forms the aperture antenna array.

FIG. 30 illustrates the iris metal layer, in which an array of antenna elements 3006 forms the aperture antenna array 3002. A cylindrical feed 3004 is at the center of the aperture antenna array 3002. In the embodiments discussed above, the resistive heating elements 2902 of the heater structure are on a layer that is in thermal contact with, but physically distinct from, the iris metal layer.

In an alternative embodiment, the iris metal that is used as part of a waveguide is also used as a heater. That is, the thermal contact between the heater structure and the iris metal layer is achieved by making the heater structure integral with the iris metal layer. In this case, the iris metal is a layer with high conductivity (in one embodiment $3\text{-}5\times 10^7$ S/m) and can form an efficient heater. In one embodiment, there is an opening in this layer where metal is etched away at every antenna element 3006 and antenna elements 3006 are placed on the perimeter of concentric rings as described above. In one embodiment, the iris metal layer is etched away completely in the area of each iris opening to form the respective antenna element 3006. Therefore, the etching amount is the thickness of the iris metal layer. This can be done in the same way that the RF elements are built. Present embodiments of the antenna use this structure, which is already there in various designs, as a heater. These periodic openings (FIG. 30), which are iris openings for antenna elements 3006 on the antenna, i.e., the aperture antenna array 3002, create low resistance paths along those rings, similar to the heater bus bar arcs 2904 described in the previous section (FIG. 29).

Most of the current will flow through these parts and most of the heating will occur in these areas. Current distribution and heating uniformity can be modified by changing connection points to the iris metal and by creating gaps in the iris metal layer to direct the current flow as seen in FIG. 31.

Figure 31:
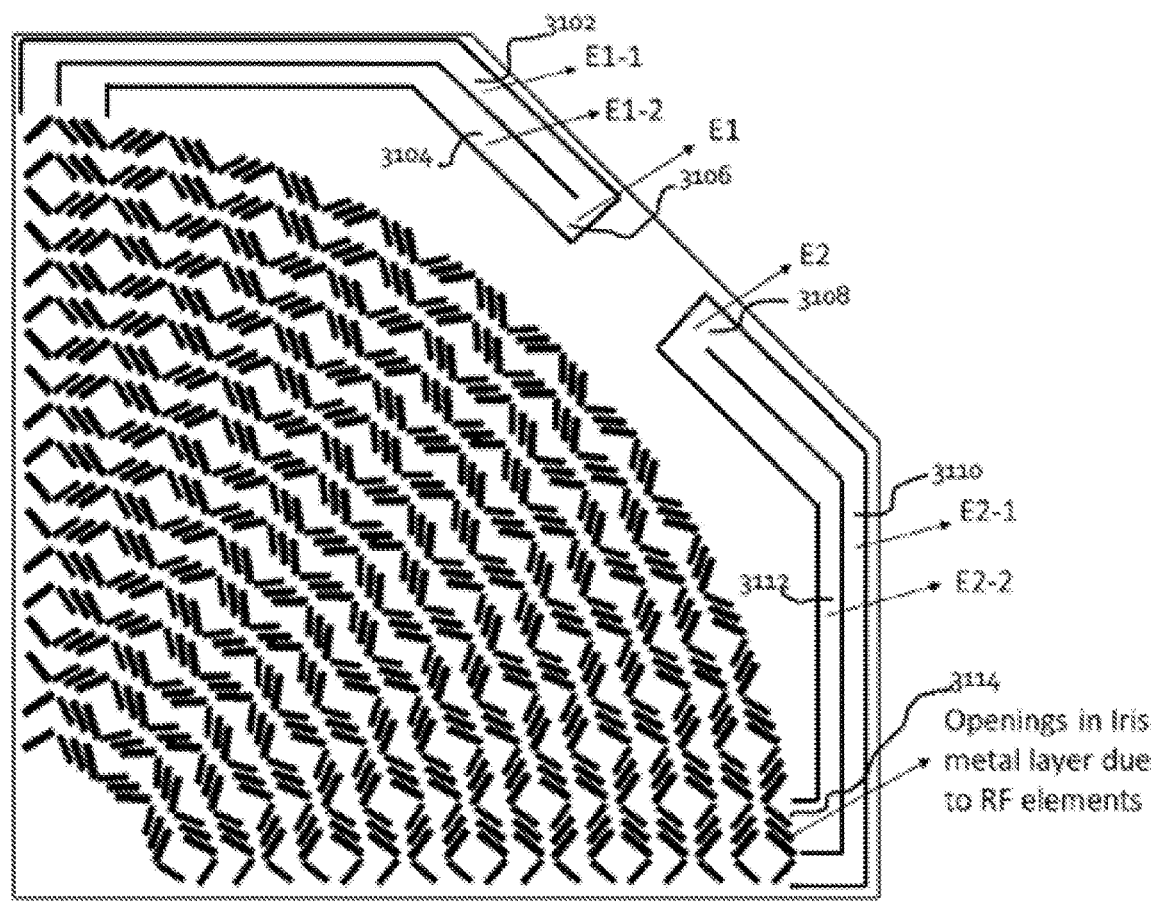
FIG. 31 illustrates a design of the heater connections for using an iris metal layer as the heater.

FIG. 31 illustrates another design of the heater connections for using the iris metal as the heater. Dark regions and dark lines show the openings in the iris metal. The dark regions and dark lines correspond to etching the iris metal layer to create the openings 3114 in the iris metal layer for the RF elements, also shown as the antenna elements 3006 (FIG. 30), and to create gaps in the iris metal layer to form the lands for the heater connections.

In one embodiment, gaps in the iris metal layer, such as shown in FIG. 31, are used outside the antenna element area to define electrical connections between a power supply (E1 and E2 electrodes 3106 and 3108 are connected to a power supply, e.g., power source 2406 in FIG. 24) and the heater. The heater here is the iris metal patterned with RF element openings, e.g., antenna elements 3006 of the aperture antenna array 3002 (FIG. 30). These electrical connections determine current input and output locations to the heater. Only one connection pair 3102 and 3104 (labeled E1-1 and E2-1, respectively) of one electrode 3106 (labeled E1) and one connection pair 3110 and 3112 (labeled E2-1 and E2-2, respectively) of another electrode 3108 (labeled E2) are shown to describe the implementation in FIG. 31, but a skilled person in the field can see that there could be tens or other numbers of heater connections in various embodiments. The final number of electrical connections in the heater structure would be determined by the size of the RF antenna. Width, or in some versions length and/or thickness, and corresponding resistance, of each electrical connection 3102, 3104, 3110, 3112 to the heater structure formed in the iris metal layer can be changed to achieve uniform heating in the aperture antenna array 3002, in various embodiments. In one embodiment, width of each electrical connection is the primary controlled design parameter for achieving uniform heating, and thickness of the corresponding metal layer is kept constant as a process variable.

For the proper antenna operation, in one embodiment, the voltage on all the iris metal should be the same, with a voltage difference and current flow through the heater structure for the heater functionality. In one embodiment, both of those requirements are satisfied by defining two modes of operation for a metamaterial antenna, for example by a controller or control module:

1) Heating mode: Two connection points to the iris metal (e.g., electrode 3106 labeled E1 and electrode 3108 labeled E2) are biased to different voltage levels and there is a current flowing through the iris metal generating heat. Heating mode can be used before starting the antenna operation to get to the optimal operation temperature.
2) Antenna mode: Two connection points to the iris metal are biased to the same voltage level and there is no current flowing through the iris metal.

In one embodiment, the metamaterial antenna first operates in the heating mode to reach the optimal operating temperature and then switches to an antenna mode. Depending on the amount of heat loss to the environment, the antenna can temporarily switch to a heating mode during operation as well. In one embodiment, the duty-cycle is divided between two modes to keep the antenna connected to the communication link and to keep the optimal temperature.

In another embodiment, a variation of the idea of using the whole iris metal layer as a heater can be realized on a new metal layer. This metal layer can again be called heater metal layer and it can be either below or above the iris metal similar to heater traces in FIG. 22 and FIG. 23. There will be a passivation layer 2206 and 2306 between the iris metal layer and the heater metal sheet. The area and shape of this heater metal sheet can be nominally the same as the iris metal layer or one can use some keepout distance (i.e. ~100 um) to prevent any impact on the RF antenna performance. The connections to the E1 and E2 electrodes 3106 and 3108 can be created similar to FIG. 31. Advantage of realizing the heater in a new metal sheet (or layer) is the ability decouple the heating functionality and the common ground for the antenna functionality. This eliminates using different operational modes as described in the previous paragraphs and the heater can also be used while antenna is operating.

There is a number of example embodiments described herein.

Example 1 is an antenna comprising an antenna aperture having a plurality of radio-frequency radiating antenna elements, the antenna aperture having a ground plane and a material for tuning permittivity or capacitance; and a heater structure in thermal contact with the material.

Example 2 is the antenna of example 1 that may optionally include that the heater structure is at least in part integral with the ground plane and comprises a plurality of resistive elements.

Example 3 is the antenna of example 1 that may optionally include that the heater structure comprises a metal layer on the ground plane distinct from an iris forming layer on the ground plane forming an iris.

Example 4 is the antenna of example 1 that may optionally include that the heater structure comprises a metal layer fabricated as a thin film transistor (TFT) array in the antenna.

Example 5 is the antenna of example 1 that may optionally include that the heater structure contacts a substrate layer, a passivation layer on the substrate layer, or an adhesion layer on the substrate layer.

Example 6 is the antenna of example 1 that may optionally include a substrate layer that comprises glass, printed circuit board, polyimide, polyester, flouropolymer, or fused silica, and an iris forming layer comprising a first metal layer, and wherein the heater structure comprises a second metal layer separated from the first metal layer by a passivation layer, and wherein the second metal layer is between the substrate and the first metal layer.

Example 7 is the antenna of example 1 that may optionally include a substrate layer that comprises glass, printed circuit board, polyimide, polyester, fluoropolymer, or fused silica, and an iris forming layer comprising a first metal layer, and wherein the heater structure comprises a second metal layer from the first metal layer by a passivation layer, and wherein the iris metal layer is between the substrate and the second metal layer.

Example 8 is the antenna of example 1 that may optionally include that the ground plane comprises a substrate layer comprising glass, printed circuit board, polyimide, polyester, fluoropolymer, or fused silica and having a first metal layer, wherein the heater structure comprises a second metal layer separated from the first metal layer and the substrate layer by a passivation layer.

Example 9 is the antenna of example 1 that may optionally include a plurality of bus bars connected to the heater structure, each of the plurality of bus bars being on a first metal layer with an iris forming layer and spaced apart from iris forming metal that forms irises for the antenna aperture.

Example 10 is the antenna of example 9 that may optionally include that the heater structure is on a second metal layer that covers at least one gap in iris forming metal.

Example 11 is the antenna of example 1 that may optionally include a first plurality of bus bars interleaved with a second plurality of bus bars and having resistive heater elements of the heater structure therebetween.

Example 2 is the antenna of example 1 that may optionally a first electrical connection point to the iris forming layer and a second electrical connection point to the iris forming layer, wherein the heater structure is integral with the iris forming layer, wherein the antenna is operable in a heating mode having the first electrical connection point and the second electrical connection point biased to differing voltage levels, and wherein the antenna is operable in an antenna mode having the first electrical connection point and the second electrical connection point biased to a same voltage level.

Example 13 is the antenna of example 1 that may optionally include that the material comprises liquid crystal (LC).

Example 14 is an antenna, comprising: an antenna aperture having a plurality of radio-frequency (RF) antenna elements, the antenna aperture having a patch substrate, a ground plane, and a material for tuning permittivity or capacitance between the patch substrate and the ground plane, the ground plane substrate having a first layer comprising an iris forming layer for irises of a plurality of radio-frequency (RF) antenna elements; and a second layer on the ground plane comprising a heater structure for heating the material.

Example 15 is the antenna of example 14 that may optionally include that the first layer comprises a first metal layer; the second layer comprises a second metal layer; and the material comprises liquid crystal.

Example 16 is the antenna of example 15 that may optionally include that the second layer comprises a metal layer fabricated as metal in a thin film transistor (TFT) array in the antenna.

Example 17 is the antenna of example 15 that may optionally include that the ground plane comprises a substrate layer, wherein the second layer comprising the heater structure contacts the substrate layer, a passivation layer on the substrate layer, or an adhesion layer on the substrate layer.

Example 18 is the antenna of example 15 that may optionally include that the heater structure is separated from the first metal layer by a passivation layer, and wherein the second metal layer is between the ground plane and the first metal layer.

Example 19 is the antenna of example 15 that may optionally include that the heater structure is separated from the first metal layer by a passivation layer, and wherein the iris metal layer is between the substrate and the second metal layer.

Example 20 is the antenna of example 14 that may optionally include that the heater structure is separated from the first layer by a passivation layer.

Example 21 is the antenna of example 14 that may optionally include that the first layer is separated from the second layer and substrate layer of the ground plane by a passivation layer.

Example 22 is the antenna of example 14 that may optionally include a plurality of bus bars connected to the heater structure.

Example 23 is the antenna of example 22 that may optionally include that each of the plurality of bus bars is on a same metal layer as the iris forming layer and spaced apart from iris forming metal that forms irises for the antenna aperture.

Example 24 is the antenna of example 22 that may optionally include that each of the plurality of bus bars is spaced apart by a gap from iris metal of the iris forming layer and is coupled to the second layer through vias.

Example 25 is the antenna of example 14 that may optionally include that wherein the antenna is operable in a heating mode in which the heater structure is driven to bring the material up to a predefined temperature, and wherein the antenna is operable in an antenna mode in which the heater structure is not driven once the material is at least at the predefined temperature.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An antenna, comprising:
    an antenna aperture having a plurality of radio-frequency (RF) radiating antenna elements, the antenna aperture having a ground plane and a material for tuning permittivity or capacitance, the ground plane having a plurality of metal layers;
    a heater structure in thermal contact with the material and is at least part integral with the plurality of metal layers, wherein the heater structure comprises a first metal layer on the ground plane distinct from a second metal layer of the ground plane used as a waveguide and part of an RF radiating antenna element; and
    at least one heater bus bar connected to the heater structure with a gap between the second metal layer and each bus bar of the at least one heater bus bars to isolate the at least one heater bus bar from the second metal layer and block RF leakage as part of the waveguide through the gap.

2. The antenna of claim 1, wherein the heater structure comprises a plurality of resistive elements.

3. The antenna of claim 1, wherein the metal layer on the ground plane is distinct from an iris forming layer on the ground plane forming an iris.

4. The antenna of claim 1, wherein the heater structure comprises a metal layer fabricated as a thin film transistor (TFT) array in the antenna.

5. The antenna of claim 1, wherein the heater structure contacts a substrate layer, a passivation layer on the substrate layer, or an adhesion layer on the substrate layer.

6. The antenna of claim 1, further comprising:
    a substrate layer that comprises glass, printed circuit board, polyimide, polyester, flouropolymer, or fused silica, and
    an iris forming layer comprising a first metal layer, and wherein the heater structure comprises a second metal layer separated from the first metal layer by a passivation layer, and wherein the second metal layer is between the substrate and the first metal layer.

7. The antenna of claim 1, further comprising:
    a substrate layer that comprises glass, printed circuit board, polyimide, polyester, fluoropolymer, or fused silica, and
    an iris forming layer comprising a first metal layer, and wherein the heater structure comprises a second metal layer from the first metal layer by a passivation layer, and wherein the iris metal layer is between the substrate and the second metal layer.

8. The antenna of claim 1, wherein the ground plane comprises a substrate layer comprising glass, printed circuit board, polyimide, polyester, fluoropolymer, or fused silica and having a first metal layer, wherein the heater structure comprises a second metal layer separated from the first metal layer and the substrate layer by a passivation layer.

9. The antenna of claim 1, wherein the at least one heater bus bar comprises a plurality of bus bars connected to the heater structure, each of the plurality of bus bars being on a first metal layer with an iris forming layer and spaced apart from iris forming metal that forms irises for the antenna aperture.

10. The antenna of claim 9 wherein the heater structure is on a second metal layer that covers at least one gap in iris forming metal.

11. The antenna of claim 1, further comprising a first plurality of bus bars interleaved with a second plurality of bus bars and having resistive heater elements of the heater structure therebetween.

12. The antenna of claim 1, further comprising:
a first electrical connection point to the iris forming layer and a second electrical connection point to the iris forming layer, wherein the heater structure is integral with the iris forming layer, wherein the antenna is operable in a heating mode having the first electrical connection point and the second electrical connection point biased to differing voltage levels, and wherein the antenna is operable in an antenna mode having the first electrical connection point and the second electrical connection point biased to a same voltage level.

13. The antenna of claim 1, wherein the material comprises liquid crystal (LC).

14. An antenna, comprising:
an antenna aperture having a plurality of radio-frequency (RF) antenna elements, the antenna aperture having a patch substrate, a ground plane having a plurality of metal layers, and a material for tuning permittivity or capacitance between the patch substrate and the ground plane, the ground plane substrate having a first layer comprising an iris forming layer for irises of a plurality of radio-frequency (RF) antenna elements;
a second layer on the ground plane comprising a heater structure for heating the material;
at least one heater bus bar connected to the heater structure with a gap between the first metal layer and each bus bar of the at least one bus bars to isolate the at least one heater bus bar from the second metal layer and block RF leakage as part of a waveguide through the gap.

15. The antenna of claim 14, wherein:
the first layer comprises a first metal layer;
the second layer comprises a second metal layer; and
the material comprises liquid crystal.

16. The antenna of claim 15 wherein the second layer comprises a metal layer fabricated as metal in a thin film transistor (TFT) array in the antenna.

17. The antenna of claim 15, wherein the ground plane comprises a substrate layer, wherein the second layer comprising the heater structure contacts the substrate layer, a passivation layer on the substrate layer, or an adhesion layer on the substrate layer.

18. The antenna of claim 15 wherein the heater structure is separated from the first metal layer by a passivation layer, and wherein the second metal layer is between the ground plane and the first metal layer.

19. The antenna of claim 15 wherein the heater structure is separated from the first metal layer by a passivation layer, and wherein the iris metal layer is between the substrate and the second metal layer.

20. The antenna of claim 14, wherein the heater structure is separated from the first layer by a passivation layer.

21. The antenna of claim 14, wherein the first layer is separated from the second layer and substrate layer of the ground plane by a passivation layer.

22. The antenna of claim 14, wherein the at least one bus bar comprises a plurality of bus bars connected to the heater structure.

23. The antenna of claim 22 wherein each of the plurality of bus bars is on a same metal layer as the iris forming layer and spaced apart from iris forming metal that forms irises for the antenna aperture.

24. The antenna of claim 22 wherein each of the plurality of bus bars is spaced apart by a gap from iris metal of the iris forming layer and is coupled to the second layer through vias.

25. The antenna of claim 14 wherein the antenna is operable in a heating mode in which the heater structure is driven to bring the material up to a predefined temperature, and wherein the antenna is operable in an antenna mode in which the heater structure is not driven once the material is at least at the predefined temperature.

* * * * *